(12) United States Patent
Nakai et al.

(10) Patent No.: US 9,912,319 B2
(45) Date of Patent: Mar. 6, 2018

(54) DUPLEXER AND COMMUNICATION MODULE

(71) Applicant: KYOCERA Corporation, Kyoto-shi, Kyoto (JP)

(72) Inventors: Tsuyoshi Nakai, Kyoto (JP); Tetsuya Kishino, Kyoto (JP); Masahisa Shimozono, Kyoto (JP); Yuriko Nishimura, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 174 days.

(21) Appl. No.: 14/896,334

(22) PCT Filed: Mar. 27, 2014

(86) PCT No.: PCT/JP2014/058989
§ 371 (c)(1),
(2) Date: Dec. 4, 2015

(87) PCT Pub. No.: WO2014/196245
PCT Pub. Date: Dec. 11, 2014

(65) Prior Publication Data
US 2016/0126932 A1    May 5, 2016

(30) Foreign Application Priority Data

Jun. 4, 2013   (JP) ................................. 2013-118149

(51) Int. Cl.
*H04B 7/24*     (2006.01)
*H03H 9/76*     (2006.01)
(Continued)

(52) U.S. Cl.
CPC .......... *H03H 9/76* (2013.01); *H03H 9/02755* (2013.01); *H03H 9/6406* (2013.01);
(Continued)

(58) Field of Classification Search
None
See application file for complete search history.

(56) References Cited

U.S. PATENT DOCUMENTS 5,306,978 A    4/1994   Yamanouchi
2004/0041666 A1    3/2004   Bergmann et al.
(Continued)

FOREIGN PATENT DOCUMENTS

JP    5-63488 A    12/1993
JP    11-136086 A    5/1999
(Continued)

OTHER PUBLICATIONS

International Search Report dated Jul. 1, 2014 and issued by the Japanese Patent Office for International Application PCT/JP2014/058989.
(Continued)

*Primary Examiner* — Kodzovi Acolatse
(74) *Attorney, Agent, or Firm* — Procopio Cory Hargreaves and Savitch LLP

(57) ABSTRACT

A branching 1 filter has an antenna terminal 3 which receives signal waves and disturbance waves, a transmission filter 11 which is connected to the antenna terminal 3, a reception filter 13 which is connected to the antenna terminal 3 and receives a portion of the signal waves and has, as a passband, a frequency range higher than a passband of the transmission filter 11, and a disturbance wave resonator which is connected to the antenna terminal 3 and to the ground and positioned closer to the antenna terminal 3 side than the transmission filter 11 and the reception filter 13. The disturbance wave resonator 15 is connected to antenna terminal 3 at a position closer to the antenna terminal 3 side than the transmission filter 11 and the reception filter 13. A resonance frequency of the disturbance wave resonator 15 is within a frequency range smaller than the passband of the transmis- (Continued)

sion filter and includes a frequency range of the disturbance waves.

22 Claims, 18 Drawing Sheets

(51) Int. Cl.
    *H03H 9/02*     (2006.01)
    *H03H 9/64*     (2006.01)
    *H03H 9/72*     (2006.01)
    *H04L 5/14*     (2006.01)
    *H03H 9/00*     (2006.01)
    *H03H 9/54*     (2006.01)

(52) U.S. Cl.
    CPC ........ *H03H 9/6483* (2013.01); *H03H 9/6489* (2013.01); *H03H 9/725* (2013.01); *H04B 7/24* (2013.01); *H04L 5/14* (2013.01); *H03H 9/0038* (2013.01); *H03H 9/542* (2013.01)

(56) References Cited

U.S. PATENT DOCUMENTS

| | | |
|---|---|---|
| 2008/0024243 A1 | 1/2008 | Iwaki et al. |
| 2010/0109801 A1 | 5/2010 | Inoue et al. |
| 2012/0068788 A1* | 3/2012 | Yamamoto ........... H03H 9/0057 333/133 |
| 2013/0039228 A1* | 2/2013 | Caron ...................... H04B 1/52 370/278 |
| 2014/0009247 A1 | 1/2014 | Moriya |
| 2014/0197903 A1* | 7/2014 | Uesaka .................. H03H 9/725 333/132 |
| 2014/0218128 A1* | 8/2014 | Fujita ................... H03H 9/6489 333/133 |

FOREIGN PATENT DOCUMENTS

| | | |
|---|---|---|
| JP | 2007-336479 A | 12/2007 |
| JP | 2010-109894 A | 5/2010 |
| JP | 2003-534698 A | 11/2013 |
| JP | 2014-13959 A | 1/2014 |
| JP | 2004-140738 A | 7/2014 |
| WO | 2013/046892 A1 | 4/2013 |
| WO | 2013/061694 A1 | 5/2013 |
| WO | WO 2013/061694 * 5/2013 ............. H03H 9/145 |

OTHER PUBLICATIONS

Office Action dated Sep. 19, 2017 issued in counterpart Japanese Application No. 2015-521324.

* cited by examiner

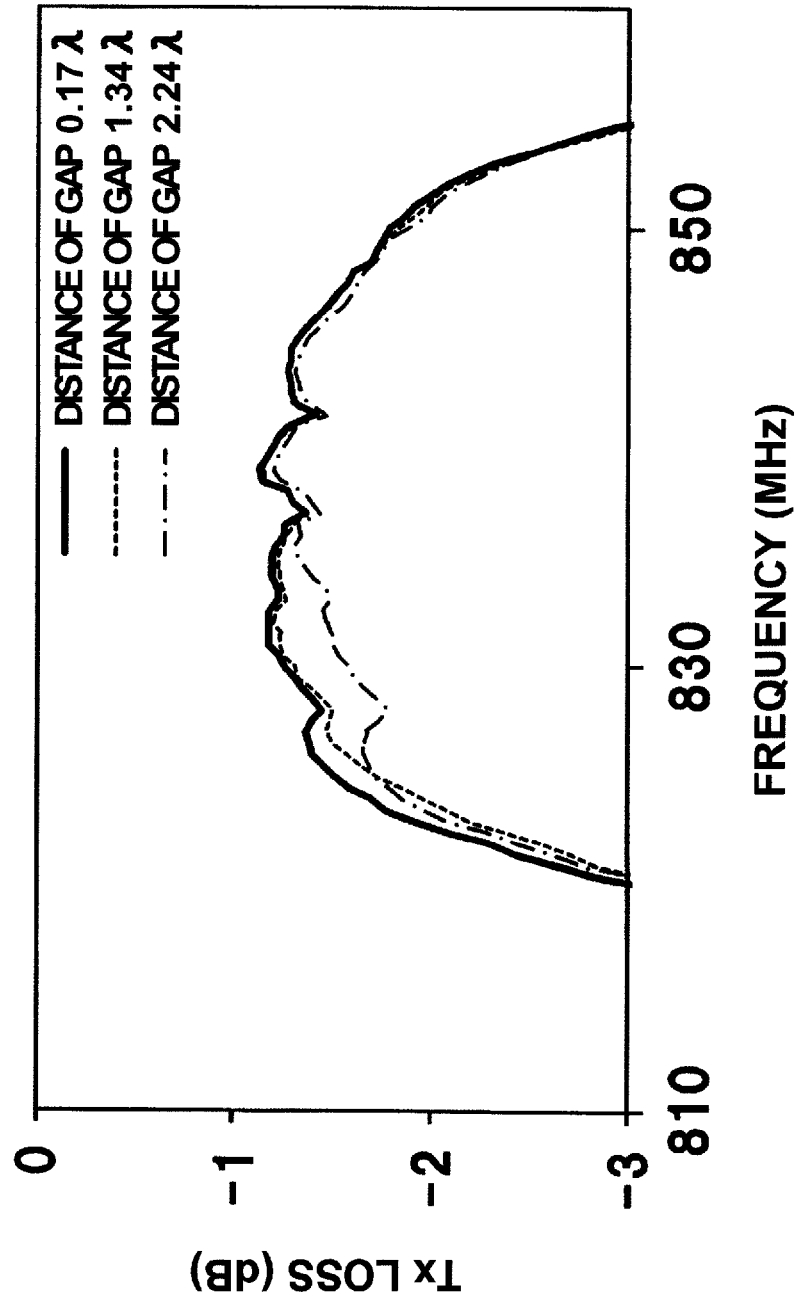

DUPLEXER AND COMMUNICATION MODULE

CROSS REFERENCE TO RELATED APPLICATIONS

The present application claims the benefit of PCT Application No. PCT/JP2014/058989filed on 27 Mar. 2014, which claims the benefit of Japanese Application No. 2013-118149, filed on 4 Jun. 2013. The contents of the above applications are incorporated by reference herein in their entirety.

TECHNICAL FIELD

The present invention relates to a duplexer and communication module utilizing acoustic waves such as surface acoustic waves (SAW).

BACKGROUND ART

In recent years, there has been known a duplexer utilizing an acoustic wave. In such a duplexer, a distorted wave may be generated due to its nonlinearity. For example, a transmission wave and an out-of-band disturbance wave out of the transmission band and reception band are liable to be mixed resulting in the generation of a distorted wave in the reception band. This distorted wave is so-called "intermodulation distortion (IMD)". This distorted wave has become one of the causes of lowering the quality of communication (SN ratio) of a wireless communication device. As art concerning a distorted wave, for example there is Patent Literature 1.

CITATIONS LIST

Patent Literature

Patent Literature 1: Japanese Patent Publication No. 2012-147175A

SUMMARY OF INVENTION

Technical Problem

In the development of duplexers in recent years, a technique reducing and lowering the influence of a distorted wave has been desired. The present invention was made in consideration with such a circumstance and has as an object thereof to provide a duplexer and communication module capable of reducing and lowering the influence of a distorted wave.

Solution to Problem

A duplexer according to one aspect of the present invention has an antenna terminal which receives signal waves and disturbance waves, a transmission filter which is connected to the antenna terminal, a reception filter which is connected to the antenna terminal and receives a portion of the signal waves and has, as a passband, a frequency range higher than the passband of the transmission filter, and a disturbance wave resonator which is connected to the antenna terminal and to the ground and positioned closer to the antenna terminal side than the transmission filter and the reception filter, wherein a resonance frequency of the disturbance wave resonator is within a disturbance wave band which is a frequency range smaller than the passband of the transmission filter and which includes the frequency range of the disturbance waves.

A communication module according to one aspect of the present invention has the above-explained duplexer, an antenna which is electrically connected to the antenna terminal, and an RF-IC which is electrically connected to the duplexer.

Advantageous Effects of Invention

According to the above configuration, the influence of distorted waves can be reduced and lowered.

BRIEF DESCRIPTION OF DRAWINGS

FIG. 7 A diagram for explaining a modification relating to the frequency characteristic of the duplexer in FIG. 2.

DESCRIPTION OF EMBODIMENTS

Figure 1:
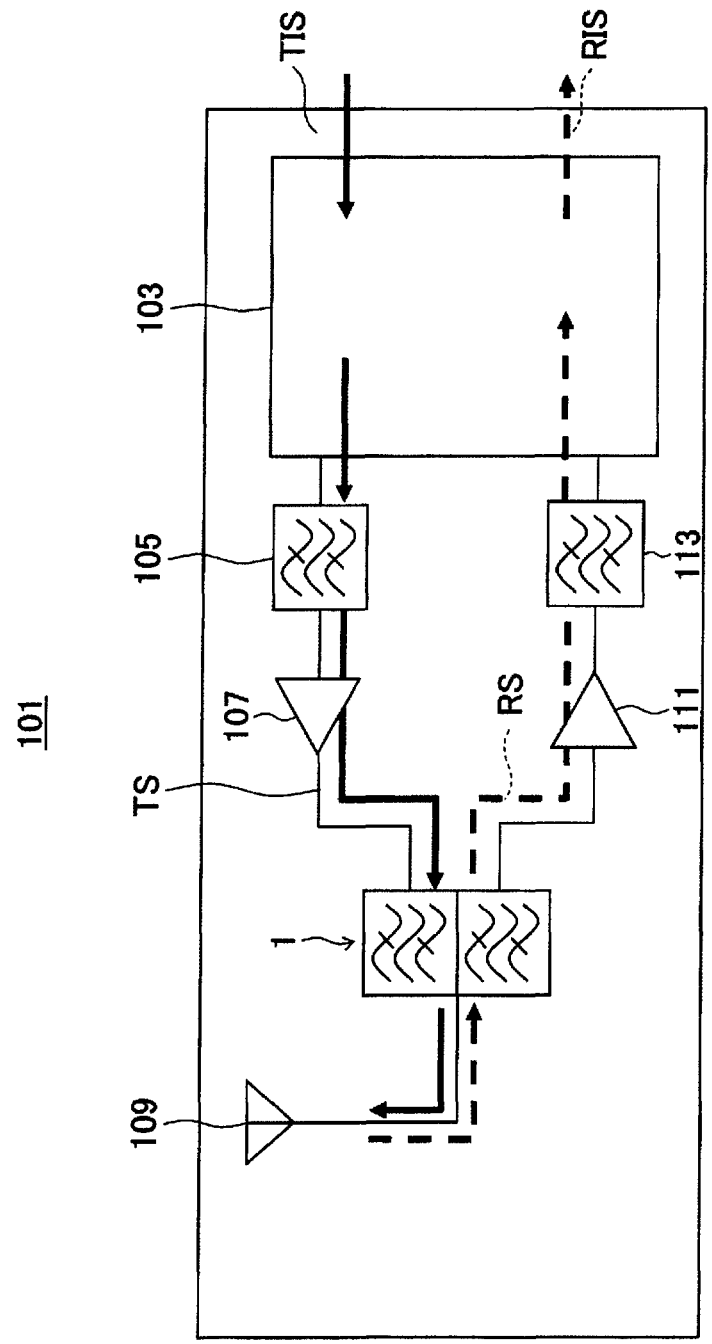
FIG. 1 A block diagram showing the configuration of a signal processing system of a communication module including a duplexer according to a first embodiment of the present invention.

Below, duplexers according to embodiments of the present invention will be explained with reference to the drawings. Note that, the drawings used in the following explanation are schematic ones. Dimensions, ratios, etc. in the drawings do not always coincide with actual ones.

The same or similar configurations will sometimes be assigned the same reference notations as each other. Further, in the second and following embodiments, explanations of the configurations which are the same as or similar to the configurations of the already explained embodiments will sometimes be omitted.

<First Embodiment>

(Basic Configurations)

FIG. 1 is a block diagram showing principal parts of an example of utilization of a duplexer 1 (duplexer) according to a first embodiment of the present invention (the example is a communication module 101). The communication module 101 is for performing wireless communications utilizing radio waves. The duplexer 1 has a function of separating a signal having a transmission frequency and a signal having a reception frequency in the communication module 101.

In the communication module 101, a transmission information signal TIS containing information to be transmitted is modulated and raised in frequency (conversion of carrier frequency to high frequency signal) by an RF-IC 103 to become a transmission signal TS. The transmission signal TS is stripped of unwanted components out of the passband for transmission by a band pass filter 105, amplified by an amplifier 107, and input to the duplexer 1. Furthermore, the duplexer 1 strips the unwanted component out of the passband for transmission from the transmission signal TS which is input and outputs the result to the antenna 109. The antenna 109 converts the input electrical signal (transmission signal TS) to a radio signal (radio wave) and transmits the same.

Further, in the communication module 101, the radio signal received by the antenna 109 is converted to an electrical signal (reception signal RS) by the antenna 109 and is input to the duplexer 1. The duplexer 1 strips unwanted components out of the passband for reception from the reception signal RS which is input and outputs the result to an amplifier 111. The output reception signal RS is amplified by the amplifier 111 and is stripped of the unwanted components out of the passband for reception by the band pass filter 113. Then, the reception signal RS is lowered in frequency and is demodulated by the RF-IC 103 to become a reception information signal RIS.

Note that, the transmission information signal TIS and reception information signal RIS may be low frequency signals (baseband signals) which contain suitable information. For example, they are analog audio signals or digital audio signals. The passband of the radio signal may be one according to various standards such as the UMTS (Universal Mobile Telecommunications System). The modulation scheme may be any of phase modulation, amplitude modulation, frequency modulation, or a combination of two or more types selected from these. As the circuit system, FIG. 1 exemplified a direct conversion system, but it may be a suitable one other than the former. For example, it may be a double superheterodyne system as well. Further, FIG. 1 schematically shows only the principal parts. A low pass filter or isolator etc. may be added at suitable positions, or the positions of the amplifier etc. may be changed.

Figure 2:
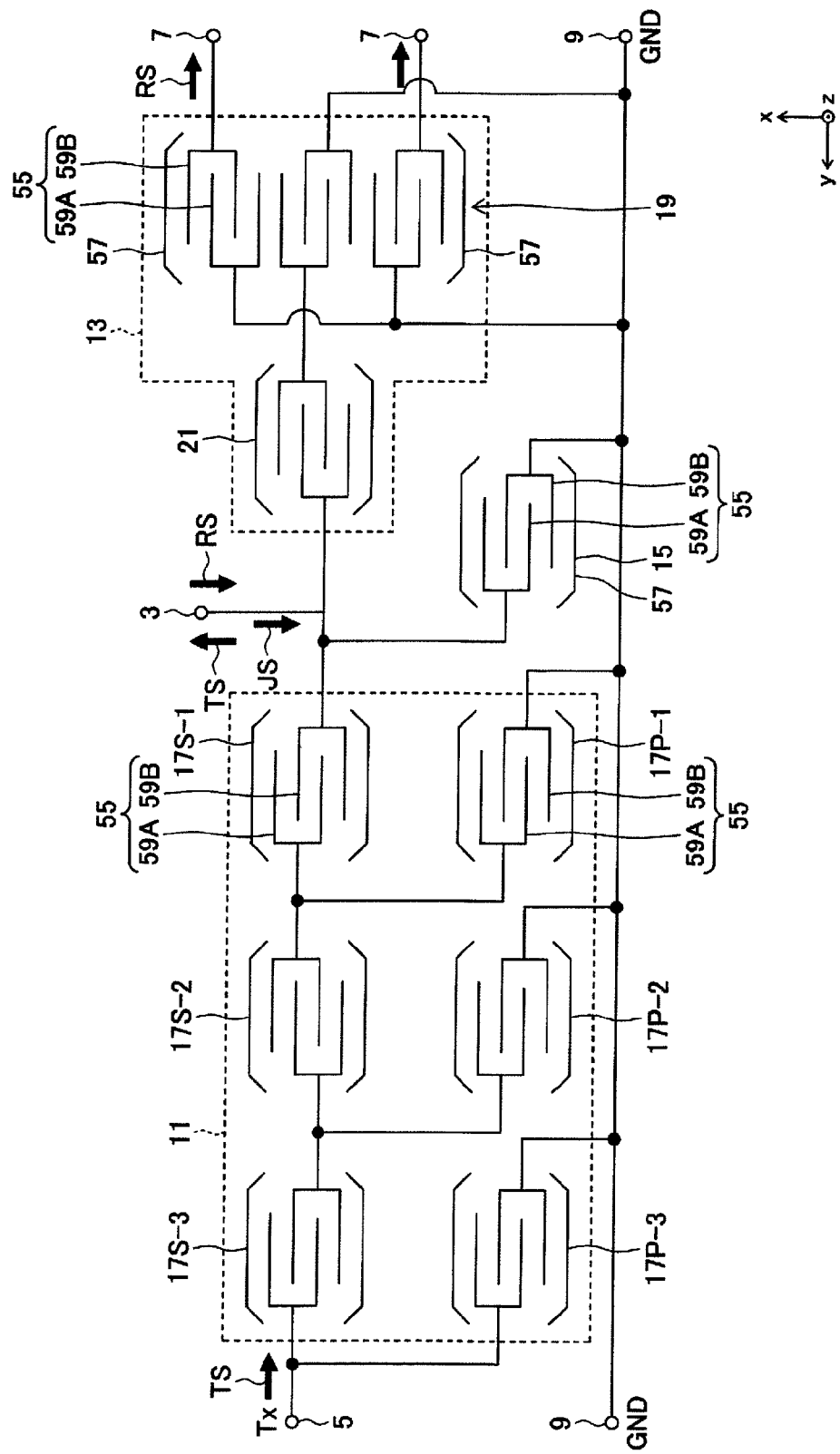
FIG. 2 A circuit diagram showing the configuration of the duplexer in FIG. 1

FIG. 2 is a circuit diagram showing the configuration of the duplexer 1.

The duplexer 1 has an antenna terminal 3 which is connected to an antenna 109, a transmission terminal 5 which receives as input a transmission signal TS, a reception terminal 7 for outputting a reception signal RS, and a ground terminal 9 given a reference potential.

Further, the duplexer 1 has a transmission filter 11 which is provided between the transmission terminal 5 and the antenna terminal 3, a reception filter 13 which is provided between the antenna terminal 3 and the reception terminal 7, and a disturbance wave resonator 15 which is provided between the antenna terminal 3 and the ground terminal 9. Note that, the disturbance wave resonator 15 can be grasped as a portion of the transmission filter 11 or reception filter 13 as well. In the present embodiment, however, this will be explained as different from the transmission filter 11 and reception filter 13.

The transmission filter 11 strips unwanted components out of the passband for transmission (transmission band) from the transmission signal TS which is input through the transmission terminal 5 and outputs the result to the antenna terminal 3. The reception filter 13 strips unwanted components out of the passband for reception (reception band) from the reception signal RS which is input through the antenna 109 and outputs the result to the reception terminal 7.

The antenna terminal 3 receives as input an out-of-band disturbance wave JS as well which is out of the transmission band and reception band. The disturbance wave resonator 15 makes the current of this disturbance wave JS run to the ground terminal 9 particularly in the vicinity of the resonance frequency. Due to this, input of the disturbance wave JS to the transmission filter 11 is suppressed. As a result, mixing of the transmission signal TS and the disturbance wave JS can be made harder in the transmission filter 11. In other words, as a result of the mixing of the transmission signal TS and the disturbance wave JS being made harder, generation of the distorted wave which becomes noise in the reception band is reduced.

On the other hand, there exists a possibility of generation of a distorted wave also from the disturbance wave resonator 15 itself. The distorted wave generated from the disturbance wave resonator 15 becomes the largest when a disturbance wave JS or transmission signal TS is applied in the vicinity of the antiresonance frequency in a range from the resonance frequency where the vibration of the SAW in the disturbance wave resonator 15 becomes the maximum to the antiresonance frequency.

The configurations of the transmission filter 11, reception filter 13, and disturbance wave resonator 15 are specifically as follows.

The transmission filter 11 is for example configured by a ladder type filter. That is, the transmission filter 11 has one or more (three in the present embodiment) of the first serial resonator 17S-1 to third serial resonator 17S-3 which are connected in series between the input side and the output side of the transmission filter 11 and one or more (three in the present embodiment) of the first parallel resonator 17P-1 to third parallel resonator 17P-3 which are provided between the above serial line and the ground terminal 9.

Note that, in the following description, sometimes the first serial resonator 17S-1 to third serial resonator 17S-3 will be simply referred to as the "serial resonators 17S" and will not be differentiated. In the same way, sometimes the first parallel resonator 17P-1 to third parallel resonator 17P-3 will be simply referred to as the "parallel resonators 17P" and will not be differentiated.

The reception filter 13 for example has a multiplex mode filter 19 and an auxiliary resonator 21 which is connected in series to the input side of the multiplex mode filter 19. Note that, in the present embodiment, the multiplex mode includes a double mode.

The disturbance wave resonator 15 is connected to the antenna terminal 3 at the position which is closer to the antenna terminal 3 side than the transmission filter 11 and also closer to the antenna terminal 3 side than the reception filter 13. In other words, the disturbance wave resonator 15 is closer to the antenna terminal 3 than the transmission filter 11 and the reception filter 13. From another viewpoint, the resonator which is the closest to the antenna terminal 3 is the disturbance wave resonator 15.

Note that, an impedance matching-use circuit or the like may be inserted among the transmission filter 11, reception filter 13, and antenna terminal 3 as well. Further, in FIG. 2, the terminal of each resonator is directly connected to another resonator or ground terminal, but a characteristic control-use circuit or the like may be inserted here as well. In particular, between the resonator and the ground terminal, a characteristic control-use inductor or wiring for generating inductance is sometimes inserted. In a case of the phrase "connected to the ground" in the present description, a case where the resonator is indirectly connected to the ground terminal by insertion of the characteristic control-use circuit or the like in this way is also included.

The serial resonators 17S, parallel resonators 17P, disturbance wave resonator 15, and auxiliary resonator 21 are for example configured by acoustic wave elements, more specifically SAW elements.

Figure 3:
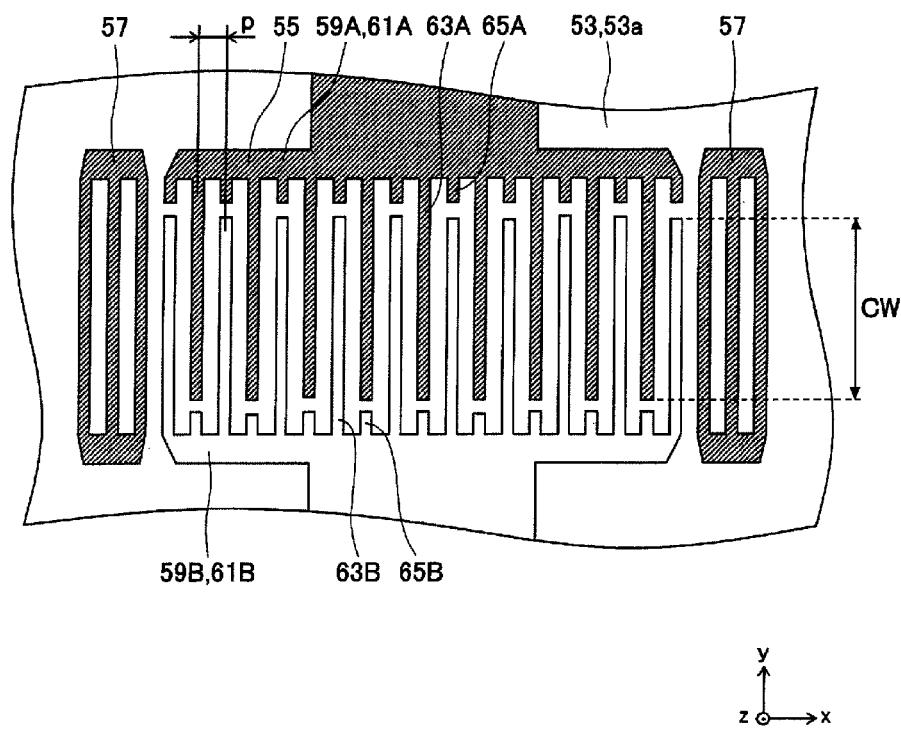
FIG. 3 A plan view showing a SAW element which configures a resonator of the duplexer in FIG. 2.

FIG. 3 is a plan view showing a SAW element 51 which configures the serial resonators 17S, parallel resonators 17P, disturbance wave resonator 15, or auxiliary resonator 21.

Note that, in the SAW element 51, any direction may be defined as upward or downward. In the following description, however, for convenience, an orthogonal coordinate system xyz will be defined, and use will be made of "upper surface", "lower surface", or another term where the positive side of the z-direction (front side of the drawing sheet in FIG. 3) will be defined as "upward".

The SAW element 51 is for example configured as a one-port SAW resonator and has a substrate 53 and has an IDT 55 and reflectors 57 which are provided on an upper surface 53a of the substrate 53. Note that, other than those described above, the SAW element 51 may have an additional film which is arranged on the upper surfaces of the IDT 55 and reflectors 57, a binder layer which is interposed between the IDT 55 and reflectors 57 and the substrate 53, and a protective film covering the upper surface 53a of the substrate 53 from the top of the IDT 55 and reflectors 57 (or additional film) as well.

The substrate 53 is configured by a piezoelectric substrate. For example, the substrate 53 is configured by a single crystal substrate having a piezoelectric property such as a lithium niobate ($LiNbO_3$) single crystal. More preferably, the substrate 53 is comprised of a 42°±10° Y-X cut $LiTaO_3$ substrate, 128°±10° Y-X cut $LiNbO_3$ substrate, or 0°±10° Y-X cut $LiNbO_3$ substrate. Other than these, use can also be made of an $LiTaO_3$, $LiNbO_3$ single crystal, silicon dioxide ($SiO_2$) single crystal, or the like which has a crystal orientation different from that described above. The planar shape and various dimensions of the substrate 53 may be suitably set. A substrate made of silicon, sapphire, or the like may be provided on the surface of the substrate 53 on which the SAW element is not formed as well.

The IDT 55 is configured by conductor patterns (conductive layer) which are formed on the upper surface 53a of the substrate 53 and has a first comb-shaped electrode 59A and second comb-shaped electrode 59B. Note that, in the following description, sometimes the first comb-shaped electrode 59A and second comb-shaped electrode 59B will be simply referred to as the "comb-shaped electrodes 59" and will not be differentiated. Further, for the configurations etc. relating to the first comb-shaped electrode 59A, sometimes the terms "first" and "A" will be attached, for example, "first bus bar 61A". For the configurations etc. relating to the second comb-shaped electrode 59B, sometimes the terms "second" and "B" will be attached, for example, "second bus bar 61B". Further, "first", "second", "A", and "B" will be sometimes omitted.

The comb-shaped electrodes 59 have two bus bars 61 facing each other, a plurality of electrode fingers 63 which extend from each bus bar 61 to the other bus bar 61 side, and a plurality of dummy electrodes 65 which extend from each bus bar 61 to the other bus bar 61 side among the plurality of electrode fingers 63. Further, a pair of comb-shaped electrodes 59 are arranged so that their plurality of electrode fingers 63 mesh (cross) with each other.

Note that, the propagation direction of the SAW is defined by the orientation etc. of the plurality of electrode fingers 63. In the present embodiment, for convenience, sometimes the orientation etc. of the plurality of electrode fingers 63 will be explained using the propagation direction of SAW as the standard.

The bus bars 61 are for example formed in a long state so as to linearly extend in the propagation direction of the SAW (x-direction) with a roughly constant width. Further, the pair of bus bars 61 face each other in the direction (y-direction) which crosses the propagation direction of the SAW (perpendicular in the present embodiment).

The plurality of electrode fingers 63 are formed in a long state so as to linearly extend in a direction (y-direction) perpendicular to the propagation direction of the SAW with roughly a constant width and are arranged at roughly constant intervals in the propagation direction of the SAW (x-direction). The plurality of electrode fingers 63 of the pair of comb-shaped electrodes 59 are provided so that their pitch "p" (for example the distance between the centers of the electrode fingers 63) becomes equal to a half wavelength of the wavelength λ of the SAW at the frequency at which resonance is to be caused. The wavelength λ is for example 1 μm to 6 μm.

The plurality of dummy electrodes 65 are for example formed in a long state so as to linearly extend in a direction (y-direction) perpendicular to the propagation direction of the SAW with roughly a constant width. Each is arranged at the center between two of the plurality electrode fingers 63 (arranged at the pitch equal to that of the plurality of electrode fingers 63). Further, the front end of a dummy electrode 65 of one comb-shaped electrode 59 faces the front end of an electrode finger 63 of the other comb-shaped electrode 59 through a gap.

The IDT 55 is for example formed by metal. As this metal, there can be mentioned for example Al or an alloy containing Al as the principal ingredient (Al alloy). The Al alloy is for example an Al—Cu alloy. Other than this, the IDT 55 may be comprised of a laminate of a metal such as Cu, Pt or Au and a dielectric such as $Ta_2O_5$ as well. Further, the IDT 55 may be configured by a plurality of metal layers as well. The thickness of the IDT 55 may be suitably set.

When a voltage is applied to the substrate 53 by the IDT 55, a SAW which is propagated in the x-direction along the upper surface 53a is induced near the upper surface 53a of the substrate 53. Further, the SAW is reflected by the electrode fingers 63. Then, a standing wave in which the pitch "p" of the electrode fingers 63 is the half wavelength is formed. The standing wave is converted to an electrical signal having the same frequency as that of the standing wave and is extracted by the electrode fingers 63. In this way, the SAW element 51 functions as a resonator or filter.

The reflector 57 is comprised of conductor patterns (conductive layer) formed on the upper surface 53a of the substrate 53 and is formed in a lattice state when viewed on a plane. That is, the reflector 57 has a pair of bus bars (reference notations omitted) which face each other in the direction crossing the propagation direction of the SAW and a plurality of electrode fingers (reference notations omitted) which extend in the direction (y-direction) perpendicular to the propagation direction of the SAW between these bus bars. The plurality of electrode fingers of the reflector 57 are arranged at roughly an equal pitch to that of the plurality of electrode fingers 63 of the IDT 55.

In the previously explained FIG. 2, as shown in the disturbance wave resonator 15 etc. with reference notations, the IDT 55 and reflectors 57 are schematically shown.

The multiplex mode filter 19 of the reception filter 13, as schematically shown in FIG. 2, has a plurality of (three in the present embodiment) IDTs 55 which are arranged in the propagation direction of the SAW and reflectors 57 which are arranged on the two sides of the plurality of IDTs 55. Further, the multiplex mode filter 19 is for example an unbalanced input-balanced output type for converting an input unbalanced signal to a balanced signal and outputting the result.

The transmission filter 11, reception filter 13, and disturbance wave resonator 15 are for example provided on the upper surface 53a of one substrate 53 together. Note that, in FIG. 2, assuming such a case, in the same way as FIG. 3, an xyz coordinate system is defined.

Figure 4:
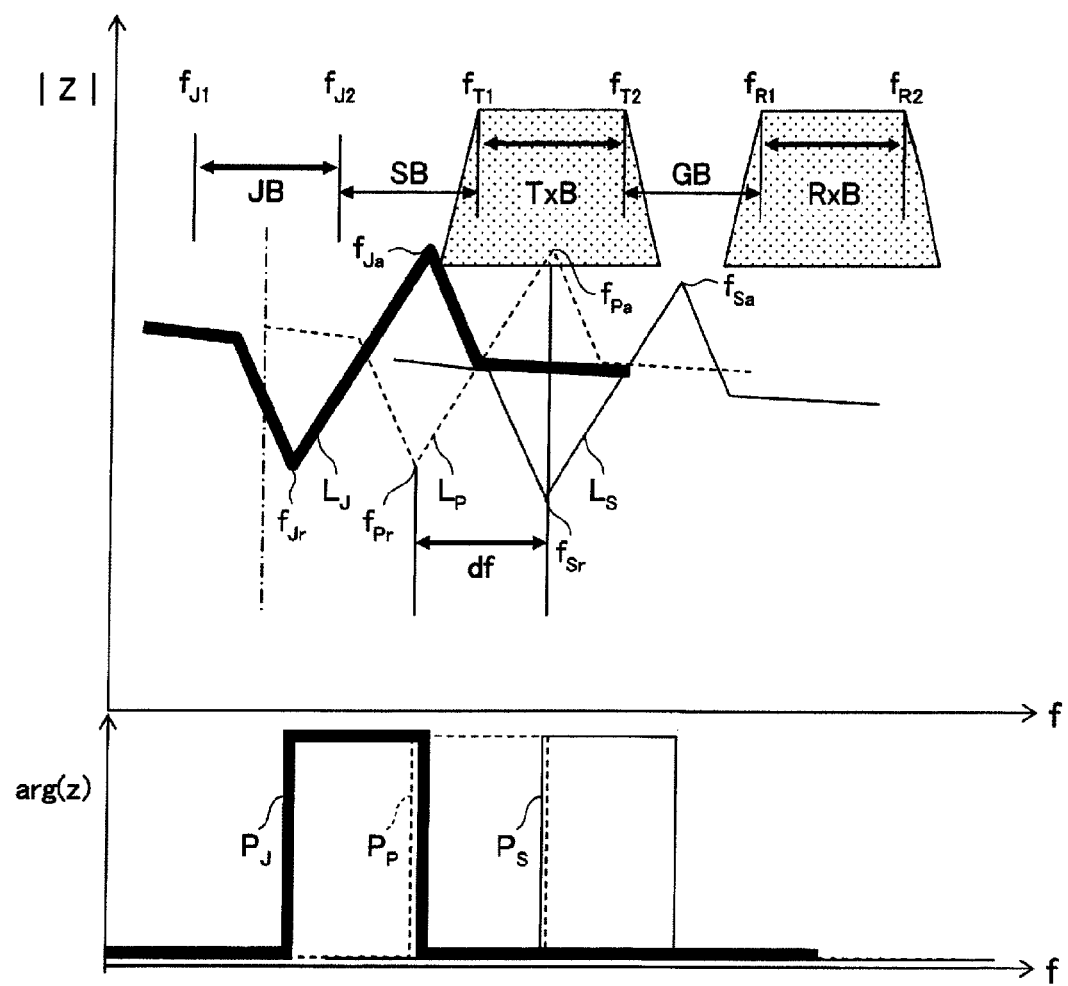
FIG. 4 A diagram for explaining a frequency characteristic of the duplexer in FIG. 2.

FIG. 4 is a diagram for explaining the frequency characteristics of various resonators and the mode of operation of the duplexer 1. In the same diagram, the abscissa shows the frequency f, and the ordinate shows an absolute value |Z| of the impedance and the phase ang(Z) of the impedance.

The transmission filter 11 has a transmission band TxB from the lower limit frequency $f_{T1}$ to the upper limit frequency $f_{T2}$ as the passband. The reception filter 13 has a reception band RxB from the lower limit frequency $f_{R1}$ to the upper limit frequency $f_{R2}$ as the passband. The reception band RxB is higher than the transmission band TxB. A guard band GB for reducing interference of signals in the two bands is provided between the transmission band TxB and the reception band RxB.

The $f_{T1}$, $f_{T2}$, $f_{R1}$, and $f_{R2}$ are for example set according to a standard such as UMTS. Note that, in the UMTS, the bandwidth of the transmission band TxB and the bandwidth of the reception band RxB are the same. That is, the following equation is satisfied:

$$f_{T2}-f_{T1}=f_{R2}-f_{R1} \quad (1)$$

In FIG. 4, a line $L_S$ indicates an example of the characteristic of absolute value of impedance with respect to frequency in the serial resonator 17S of the transmission filter 11, a line $P_S$ indicates an example of the characteristic of phase of impedance with respect to frequency in the serial resonator 17S of the transmission filter 11, a line $L_P$ indicates an example of the characteristic of absolute value of impedance with respect to frequency in the parallel resonator 17P of the transmission filter 11, a line $P_P$ indicates an example of the characteristic of phase of impedance with respect to frequency in the parallel resonator 17P, a line $L_J$ indicates an example of the characteristic of absolute value of impedance with respect to the frequency in the disturbance wave resonator 15, and a line $P_J$ indicates an example of the characteristic of phase of impedance with respect to frequency in the disturbance wave resonator 15.

As well known, the ladder type filter (transmission filter 11) is configured so that the resonance frequency $f_{Sr}$ of the serial resonator 17S and the antiresonance frequency $f_{Pa}$ of the parallel resonator 17P roughly coincide and so that the frequency difference df between the resonance frequency and the antiresonance frequency ($f_{Sa}-f_{Sr}$, $f_{Pa}-f_{Pr}$) becomes roughly equal to the bandwidth of the transmission band TxB. By such a configuration, the ladder type filter functions as a filter using a frequency range which has the resonance frequency $f_{Sr}$ as the center and in which the bandwidth roughly becomes the frequency difference df as the passband. Note, the relationships of frequencies described above are the basic design concept of a duplexer using piezoelectric resonators. In an actual duplexer, sometimes the resonance frequencies of the resonators and the frequency difference are finely adjusted so as to obtain the predetermined electric characteristics.

Accordingly, in the transmission filter 11 having the transmission band TxB as the passband, the resonance frequency $f_{Sr}$ of the serial resonator 17S and the antiresonance frequency $f_{Pa}$ of the parallel resonator 17P are positioned at roughly the center of the transmission band TxB. Further, the frequency difference df is roughly equal to the bandwidth of the transmission band TxB ($f_{T2}-f_{T1}$), therefore the antiresonance frequency $f_{Sa}$ of the serial resonator 17S is higher than the transmission band TxB, and the resonance frequency $f_{Pr}$ of the parallel resonator 17P is lower than the transmission band TxB.

Here, as the distorted wave due to the intermodulation distortion, when the frequency of the disturbance wave is $f_J$ and the frequency of the transmission wave is $f_T$, there is a distorted wave based on a third-order nonlinearity having $f_{IM}=2f_T-f_J$ as the frequency. When the frequency $f_{IM}$ of the distorted wave is within the reception band RxB, the SN ratio of the reception signal RS falls. Accordingly, if the range (disturbance wave band JB) of $f_J$ satisfying such a condition is found by back calculation from the reception band RxB or the like and the resonance frequency $f_{Jr}$ of the disturbance wave resonator 15 is set within that disturbance wave band JB, a current of disturbance waves which becomes the cause of generation of the distorted wave causing a drop in the SN ratio can be suitably made to run to the ground terminal 9, and input of the disturbance waves to the transmission filter 11 and reception filter 13 can be prevented. That is, the distorted wave causing a drop of the SN ratio can be suitably reduced.

Note that, in the standard such as the UMTS, the relationship between the frequency $f_T$ of the transmission wave and the frequency $f_R$ of the reception wave is:

$$f_R=f_T+\text{bandwidth of } TxB+\text{bandwidth of } GB=f_T+(f_{T2}-f_{T1})+(f_{R1}-f_{T2}) \quad (2)$$

Therefore, the range of $f_J$ where a distorted wave in accordance with the third-order nonlinearity having $f_{IM}=2f_T-f_J$ as the frequency enters into the reception band RxB becomes the range satisfying bandwidth of SB=bandwidth of GB and bandwidth of JB=bandwidth of TxB=bandwidth of RxB in FIG. 4. That is, the range of $f_J$ is:

$$2f_{T1}-f_{R1}<f_J<2f_{T2}-f_{R2} \quad (3)$$

That is, when the resonance frequency $f_{Jr}$ of the disturbance wave resonator 15 is set as follows, $$2f_{T1}-f_{R1}<f_{Jr}<2f_{T2}-f_{R2} \quad (4)$$

the effect of suppression of intermodulation distortion as described above is obtained.

In FIG. 4, the lower limit frequency $f_{J1}$ of the disturbance wave band JB is the left side in (3) ($f_{J1}=2f_{T1}-f_{R1}$). The upper limit frequency $f_{J2}$ of the disturbance wave band JB is the right side in (3) ($f_{J2}=2f_{T2}-f_{R2}$). As shown in this diagram, the disturbance wave band JB is a band which is symmetric with the reception band RxB concerning the transmission band TxB. Note that, the bandwidth of the space band SB between the disturbance wave band JB and the transmission band TxB is the same as the bandwidth of the guard band GB.

Depending on the relative size between the bandwidth of the transmission band TxB and the bandwidth of the guard band GB, the resonance frequency $f_{Pr}$ of the parallel resonator 17P may become a frequency within the disturbance wave band JB. Specifically, as explained above, the antiresonance frequency $f_{Pa}$ of the parallel resonator 17P is set to the frequency at the center of the transmission band TxB, and the frequency difference $df_P$ between the resonance frequency $f_{Pr}$ and the antiresonance frequency $f_{Pa}$ of the parallel resonator 17P is made roughly the same as the bandwidth of the transmission band TxB. Therefore, if the bandwidth of the guard band GB is smaller than a half of the bandwidth of the transmission band TxB, the resonance frequency $f_{Pr}$ of the parallel resonator 17P may become a frequency within the disturbance wave band JB.

Conversely, if the bandwidth of the guard band GB is larger than a half of the bandwidth of the transmission band TxB ($f_{R1}-f_{T2}>(f_{T2}-f_{T1})/2$), in an ordinary setting method, the resonance frequency $f_{Pr}$ of the parallel resonator 17B does not become a frequency within the disturbance wave band JB. As such a standard, for example, there can be mentioned the UMTS bands 1, 2, 4 to 7, 9 to 12, 15 to 19, and 21 to 23. Note that, as a standard whereby the bandwidth of the guard band GB becomes smaller than a half of the bandwidth of the transmission band TxB, there can be mentioned for example the UMTS bands 3, 8, 25, 26, and 28.

Unlike the parallel resonator 17P, the disturbance wave resonator 15 does not form part of the transmission filter 11 (ladder type filter). Accordingly, the antiresonance frequency $f_{Ja}$ of the disturbance wave resonator 15 need not coincide with the resonance frequency $f_{Sr}$ of the serial resonator 17S or need not be within the transmission band TxB either. The frequency difference $df_J$ ($=f_{Ja}-f_{Jr}$) between the resonance frequency $f_{Jr}$ and the antiresonance frequency $f_{Ja}$ of the disturbance wave resonator 15 need not be made equal to the bandwidth of the transmission band TxB ($f_{T2}-f_{T1}$) either. These may be suitably set.

For example, the antiresonance frequency $f_{Ja}$ of the disturbance wave resonator 15 deviates to the low frequency side or high frequency side by an amount of 10% or more of the bandwidth ($f_{T2}-f_{T1}$) of the transmission band TxB relative to the resonance frequency $f_{Sr}$ of the serial resonator 17S (center of the transmission band TxB).

Further, for example, as shown in FIG. 4, the antiresonance frequency $f_{Ja}$ of the disturbance wave resonator 15 deviates to the low frequency side by an amount larger than ½ of the bandwidth ($f_{T2}-f_{T1}$) of the transmission band TxB relative to the resonance frequency $f_{Sr}$ of the serial resonator 17S. From another viewpoint, the antiresonance frequency $f_{Ja}$ of the disturbance wave resonator 15 is made lower than the transmission band TxB ($f_{Ja}<f_{T1}$).

In this case, the band between the resonance frequency $f_{Jr}$ and the antiresonance frequency $f_{Ja}$ of the disturbance wave resonator 15 is out of the transmission band TxB. As a result, the SAW vibration of the disturbance wave resonator 15 no longer becomes large due to the transmission wave. Therefore, for example, generation of a distorted wave due to mixing of the disturbance waves and the transmission wave in the disturbance wave resonator 15 can be reduced.

Further, for example, in the case where the antiresonance frequency $f_{Ja}$ of the disturbance wave resonator 15 is made lower than the transmission band TxB as described above, as shown in FIG. 4, the antiresonance frequency $f_{Ja}$ is made higher than the upper limit frequency $f_{J2}$ of the disturbance wave band ($f_{J2}<f_{Ja}$).

In this case, for example, SAW vibration of the disturbance wave resonator 15 due to the disturbance waves no longer becomes larger, therefore generation of a distorted wave due to mixing of the disturbance waves and the transmission wave in the disturbance wave resonator 15 can be reduced. Further, for example, the disturbance wave resonator 15 is low in impedance in the disturbance wave band JB, therefore current of the disturbance waves is apt to flow to the ground terminal 9, so generation of a distorted wave is suppressed.

Note that, if the frequency difference $df_J$ between the resonance frequency $f_{Jr}$ and the antiresonance frequency $f_{Ja}$ of the disturbance wave resonator 15 is set to the same extent as the bandwidth of the disturbance wave band JB, when the resonance frequency $f_{Jr}$ is higher than the frequency at the center of the disturbance wave band JB (($f_{J1}+f_{J2})/2<f_{Jr}$), the antiresonance frequency $f_{Ja}$ is reliably made higher than the upper limit frequency $f_{J2}$ of the disturbance wave band. Due to this, a frequency whereby the distorted wave generated from the disturbance wave resonator becomes the maximum is out of the disturbance wave band.

As described above, the antiresonance frequency $j_{Ja}$ and frequency difference $df_J$ of the disturbance wave resonator 15 may be suitably set unlike the antiresonance frequency $f_{Pa}$ and frequency difference $df_P$ of the parallel resonator 17P. Note, in the same way as the parallel resonator 17P, the disturbance wave resonator 15 may be configured so that the antiresonance frequency $f_{Ja}$ becomes equal to the resonance frequency $f_{Sr}$ of the serial resonator 17S or may be configured so that the frequency difference $df_J$ becomes equal to the bandwidth of the transmission band TxB. FIG. 4 exemplifies a case where the frequency difference $df_J$ is made equal to the bandwidth of the transmission band TxB.

The transmission filter 11 or reception filter 13 is configured by a combination of a plurality of resonators. As understood from this fact, the disturbance wave resonator 15 exerts an influence upon the filter characteristic of the duplexer 1. Accordingly, the transmission filter 11 may be designed based on the influence of the disturbance wave resonator 15. For example, compared with a case where the disturbance wave resonator 15 is not provided, the capacity may be set smaller by making the number in IDT smaller or making the intersection portion for facing in IDT narrower.

Further, as in the present embodiment, the disturbance wave resonator 15 is arranged on the antenna terminal 3 side in the transmission filter 13, therefore a distorted wave can be efficiently reduced. When the disturbance wave JS is input through the antenna terminal 3 to the transmission filter 11, it gradually attenuates while passing through the transmission filter 11. In other words, the intensity of the disturbance wave JS in the transmission filter 11 configured by the ladder type filter becomes stronger in the resonator closer to the antenna terminal 3. For this reason, by arranging the disturbance wave resonator 15 closer to the antenna terminal 3 side than the resonator configuring the transmission filter 11, most of the disturbance wave JS will flow to the disturbance wave resonator 15. As a result, flow of the disturbance wave JS in the transmission filter 11 can be made harder.

(Modification Relating to Frequency Characteristic etc.)

Figure 5A:
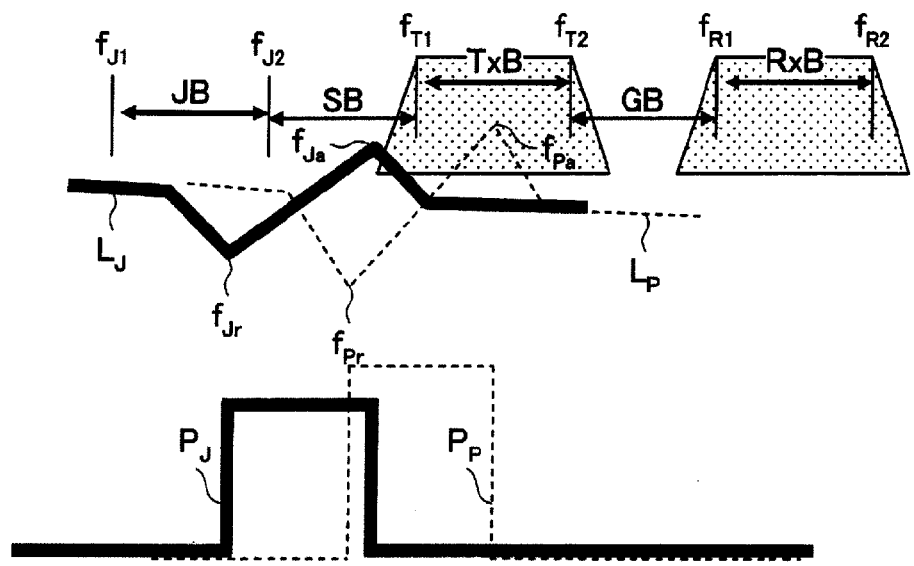
FIG. 5A to FIG. 5C are diagrams for explaining modifications relating to a frequency characteristic of the duplexer in FIG. 2.
Figure 5B:
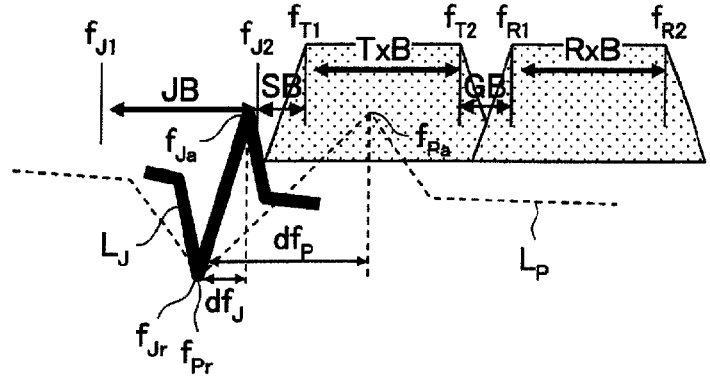
Figure 5C:
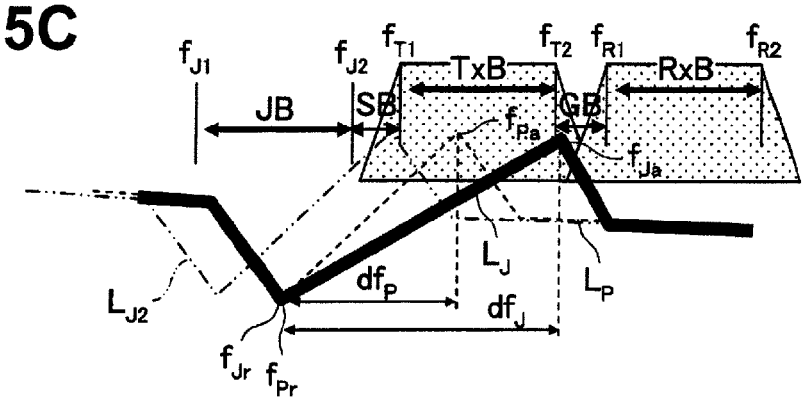

Each of FIG. 5A to FIG. 5C is a diagram, similar to FIG. 4, which shows the frequency characteristic of the disturbance wave resonator 15 according to a modification. In the same way as FIG. 4, the line $L_J$ indicates the frequency-impedance characteristic of the disturbance wave resonator 15, and the line $L_P$ indicates the frequency-impedance characteristic of the parallel resonator 17P. Note that, in each diagram, the coordinate axes etc. of the frequency "f" and the absolute value |Z| f impedance are suitably omitted. Further, in the same way as FIG. 4, the line $P_J$ indicates the characteristic of phase of impedance with respect to frequency in the disturbance wave resonator 15, and the line $P_P$ indicates the characteristic of phase of impedance with respect to frequency in the parallel resonator 17P. Note that, in each diagram, the coordinate axes etc. of the frequency "f" and the phase are suitably omitted.

The disturbance wave resonator 15 according to the modification in FIG. 5A is configured so that the maximum value of the phase of impedance becomes smaller than the maximum value of the phase of impedance of the parallel resonator 17P (the mean value of the maximum values in a case where they are different from each other among the plurality of parallel resonators 17P). The maximum value of the phase of impedance of the resonator has correlation with a loss and Q-value of the resonator. The larger the loss of the resonator (the smaller the Q-value), the smaller the maximum value of the phase of impedance. That is, this shows that the Q-value of the disturbance wave resonator 15 is lower than the Q-value of the parallel resonator 17P.

In this case, the distorted wave generated from the disturbance wave resonator 15 becomes small. This is because, for example, even when the disturbance wave JS is applied to the frequency in a range from the resonance frequency to the antiresonance frequency of the disturbance wave resonator 15, the SAW vibration does not become large due to loss. Accordingly, the distorted wave generated from the disturbance wave resonator 15 becomes small. As a result, generation of a distorted wave is suppressed as a whole.

FIG. 5B exemplifies a case where the bandwidth of the guard band GB is relatively narrow. In other words, FIG. 5B exemplifies a case where the bandwidth of the space band SB is relatively narrow. For example, the bandwidth of the guard band GB is smaller than a half of the bandwidth of the transmission band TxB.

The disturbance wave resonator 15 according to the modification in FIG. 5B is configured so that the frequency difference $df_J$ between the resonance frequency $f_{Jr}$ and the antiresonance frequency $f_{Ja}$ becomes smaller than the frequency difference $df_P$ between the resonance frequency $f_{Pr}$ and the antiresonance frequency $f_{Pa}$ of the parallel resonator 17P (the mean value of the frequency differences $df_P$ in a case where they are different from each other among the plurality of parallel resonators 17P). From another viewpoint, the frequency difference $df_J$ is made smaller than the bandwidth of the transmission band TxB. For example, the frequency difference $df_J$ is smaller than the frequency difference $df_P$ (mean value) of the plurality of parallel resonators 17P or the bandwidth of the transmission band TxB with a difference of 10% or more of the frequency difference $df_P$ (mean value) or the bandwidth.

In this case, for example, even when the bandwidth of the space band SB is narrow, the antiresonance frequency $f_{Ja}$ of the disturbance wave resonator 15 can be made lower than the transmission band TxB. As a result, as explained with reference to FIG. 4, mixing of the disturbance wave and the transmission wave in the disturbance wave resonator 15 can be reduced. Note that, in FIG. 5B, the antiresonance frequency $f_{Ja}$ is within the disturbance wave band JB, but the antiresonance frequency $f_{Ja}$ may be within the space band SB as well.

FIG. 5C exemplifies a case where the bandwidth of the guard band GB is relatively narrow in the same way as FIG. 5B. In other words, FIG. 5C exemplifies a case where the bandwidth of the space band SB is relatively narrow. For example, the bandwidth of the guard band GB is smaller than a half of the bandwidth of the transmission band TxB.

The disturbance wave resonator 15 according to the modification in FIG. 5C is, converse to the modification in FIG. 5B, configured so that the frequency difference $df_J$ between the resonance frequency $f_{Jr}$ and the antiresonance frequency $f_{Ja}$ becomes larger than the frequency difference $df_P$ between the resonance frequency $f_{Pr}$ and the antiresonance frequency $f_{Pa}$ of the parallel resonator 17P (the mean value of the frequency differences $df_P$ in a case where they are different from each other among the plurality of parallel resonators 17P). From another viewpoint, the frequency difference $df_J$ is made larger than the bandwidth of the transmission band TxB. For example, the frequency difference $df_J$ is larger than the frequency difference $df_P$ (mean value) of the plurality of parallel resonators 17P or the bandwidth of the transmission band TxB with a difference of 10% or more of the frequency difference $df_P$ (mean value) or bandwidth.

In this case, for example, the slope of rise of impedance from the resonance frequency $f_{Jr}$ to the antiresonance frequency $f_{Ja}$ becomes gentle. Therefore, even when the bandwidth of the space band SB is narrow, the impedance of the disturbance wave resonator 15 in the disturbance wave band JB can be lowered. As a result, the current of the disturbance waves more easily flows through the disturbance wave resonator 15 to the ground terminal 9. As a result, generation of a distorted wave is reduced.

Note that, which of the modification in FIG. 5B and the modification in FIG. 5C is preferred for an improvement of SN ratio differs according to the bandwidths of the various bands and impedance characteristics etc. of the various resonators. In working the invention, either may be suitably selected based on experiments etc.

In the example indicated by the line $L_J$ in FIG. 5C, by positioning the resonance frequency $f_{Jr}$ of the disturbance wave resonator 15 near the center of the disturbance wave band JB and keeping the antiresonance frequency $f_{Ja}$ at a distance from the disturbance wave band JB, the frequency difference $df_J$ is made larger. Note that, as already explained, such an antiresonance frequency $f_{Ja}$ is not set in the parallel resonator 17P.

Further, in FIG. 5C, the line $L_{J2}$ also shows the frequency characteristic of the disturbance wave resonator 15 according to the modification. In this example, by lowering the resonance frequency $f_{Jr}$ to a certain extent or as much as possible within the range of the disturbance wave band JB, the frequency difference $df_J$ is made larger. In this case, the distorted wave can be reduced by lowering the impedance of the disturbance wave resonator 15 over a broad range around the disturbance wave band JB.

The frequency characteristic of the disturbance wave resonator 15 explained with reference to FIG. 4 and FIG. 5A to FIG. 5C may be set by a suitable method including a known method. For example, the resonance frequency $f_{Jr}$ is set according to the pitch (FIG. 3) as already explained. The antiresonance frequency $f_{Ja}$ is for example set according to a ratio of a motional capacitance and a static capacitance (capacity ratio). The capacity ratio is for example set according to the crossing width CW (FIG. 3) of the IDT 55, number of the electrode fingers 63, a ratio of a electrode to a gap between electrodes in the IDT 55 (duty ratio), thickness of the IDT electrode 55, thickness of a protective film, and so on. Further, the capacity ratio can be adjusted by adding a capacitance C or inductance L in series/parallel to the resonator as well. Specifically, when the capacitance C is added in parallel/series to the resonators, the frequency difference df of the resonators can be made smaller. When the inductance L is added in parallel/series, the frequency difference df of the resonators can be made larger. A technique of making the maximum value of phase of impedance smaller can be realized by for example leakage of the SAW vibration to the outside of the resonator by making the distance of the gap between the front end of an electrode finger and a dummy electrode (or between the front end of an electrode finger and a bus bar electrode) larger, decreasing the number of reflectors, or the like.

Figure 6:
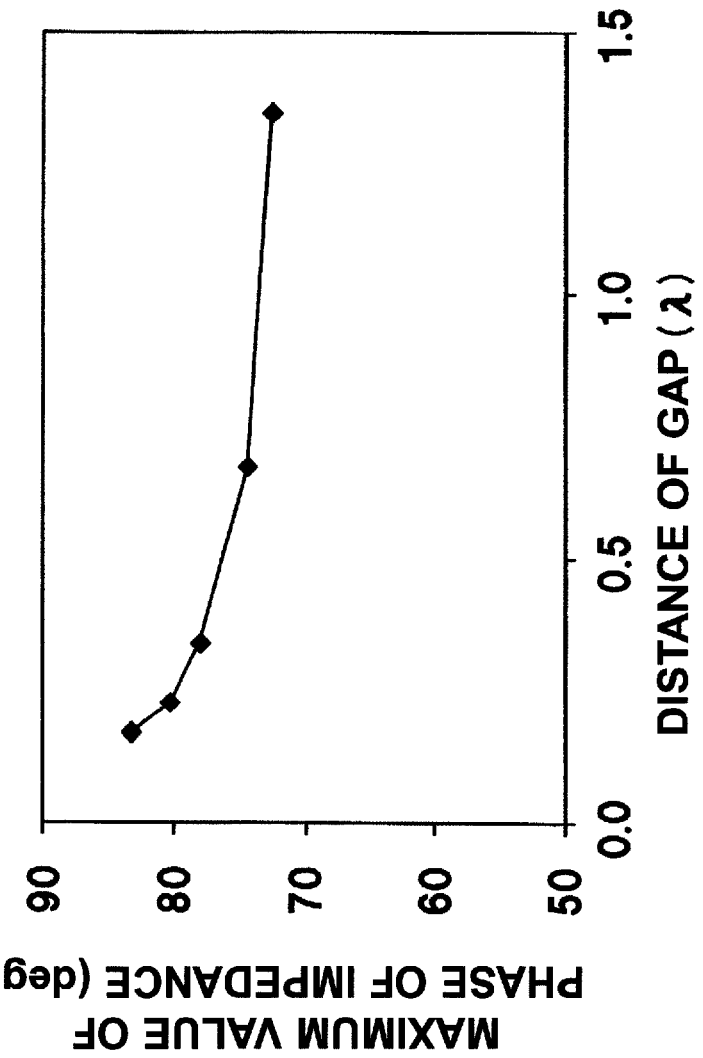
FIG. 6 A diagram for explaining a modification relating to a phase characteristic of an impedance of a disturbance wave resonator in FIG. 2.

FIG. 6 shows the characteristic of the maximum value of phase of impedance of the disturbance wave resonator 15 in a case where the distance of the gap of the front end of the electrode finger is changed. Note that, the ordinate in FIG. 6 indicates the maximum value of the phase of the impedance, and the abscissa indicates the distance of the gap. By making the distance of the gap of the front end of the electrode finger larger, the maximum value which is taken by the phase of the impedance can be made smaller. For this reason, desirably the distance of the gap of the disturbance resonator is broader than the distance of the gap of the other resonators (the mean value where the plurality of gaps are not the same).

Note, as shown in FIG. 7, when the distance of the gap of the front end of the electrode finger is too broad, the filter characteristic becomes bad. Therefore, suitably the distance of the gap of the front end of the electrode finger is not more than 2.2λ. Further, even in a case where there is no dummy electrode 65 which faces the front end of the electrode finger, in the same way, that effect can be obtained by leakage of SAW vibration to the outside of the resonator.

Note that, in an actual product, when judging whether the frequency characteristic of the disturbance wave resonator 15 is set as in the present embodiment relative to the transmission band TxB and to the reception band RxB, the transmission band TxB and reception band RxB may be suitably specified. In general, the duplexer is configured so as to satisfy the standard, therefore the standard which is aimed at by the duplexer to be judged may be specified based on a pamphlet or specifications etc. and then the transmission band TxB and the reception band RxB may be specified from the above standard. That is, the transmission band TxB and reception band RxB need not to be specified according to actual measurement of the filter characteristic of the duplexer to be judged and do not fluctuate according to the level of quality of the duplexer to be judged.

Figure 8A:
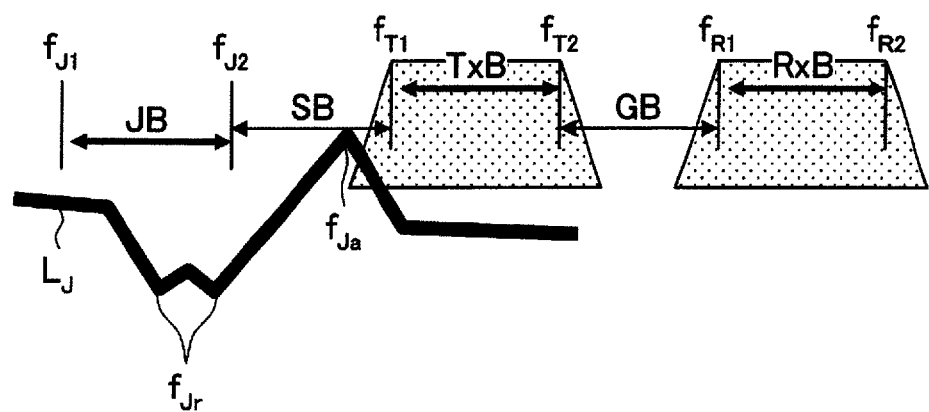
FIG. 8A and FIG. 8B are diagrams for explaining another modification relating to the frequency characteristic of the duplexer in FIG. 2.

FIG. 8A is a diagram, similar to FIG. 4 etc., which shows the frequency characteristic of the disturbance wave resonator 15 according to a modification.

The disturbance wave resonator 15 according to the modification in FIG. 8A has a plurality of (two in the example of FIG. 8A) resonance frequencies $f_{jr}$ within the disturbance wave band JB. In this case, the impedance of the disturbance wave resonator 15 is made low over a broad range in the disturbance wave band JB, and thus the current of the disturbance waves can be made to run to the ground terminal 9. As a result, generation of a distorted wave is reduced.

Figure 8B:
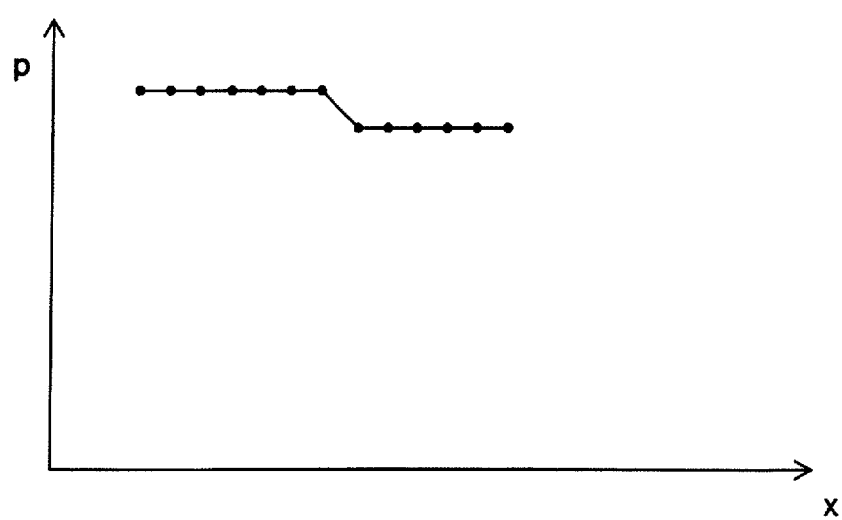

FIG. 8B is a diagram for explaining an example of a method of realizing the frequency characteristic in FIG. 8A. In this diagram, the abscissa shows the position in the x-direction in FIG. 3 (direction of arrangement of the electrode fingers 63), and the ordinate shows the pitch "p" of the electrode fingers 63. As shown in this diagram, by providing a plurality of pitches "p" in the IDT 55 which are different in size from each other, a plurality of resonance frequencies $f_{jr}$ can be realized.

<Second Embodiment>

Figure 9A:
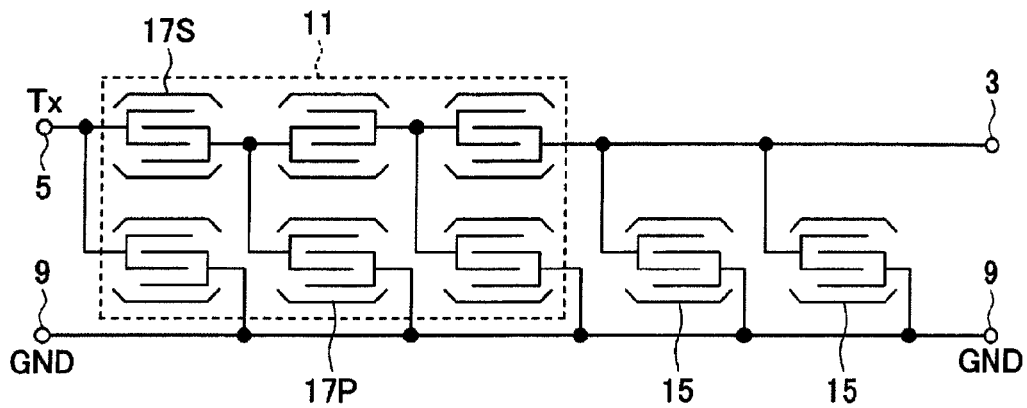
FIG. 9A to FIG. 9C are diagrams for explaining a duplexer according to a second embodiment.

FIG. 9A is a schematic view, similar to FIG. 2, which shows a duplexer 201 according to a second embodiment. Note, in FIG. 9A, illustration of the reception filter 13 and reception terminal 7 is omitted.

The duplexer 201 differs from the duplexer 1 in the first embodiment in the point that a plurality of (two in the example in FIG. 9A) disturbance wave resonators 15 which are connected in parallel to each other are provided.

Figure 9B:
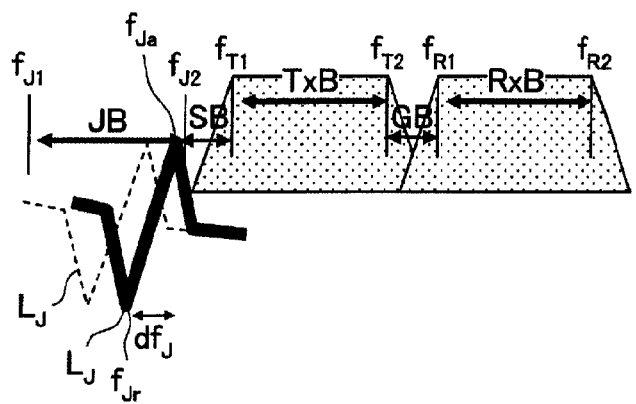

FIG. 9B is a diagram, similar to FIG. 4, which shows the frequency characteristic of the disturbance wave resonator 15. In FIG. 9B, in the same way as FIG. 5B, a case where the bandwidth of the space band SB is narrow is exemplified.

The frequency characteristic (line $L_J$) of each disturbance wave resonator 15 is for example similar to the frequency characteristic of the disturbance wave resonator 15 according to the modification in FIG. 5B. That is, in each disturbance wave resonator 15, the frequency difference $df_J$ between the resonance frequency $f_{Jr}$ and the antiresonance frequency $f_{Ja}$ is relatively narrow.

The plurality of disturbance wave resonators 15 are different in the resonance frequency $f_{Jr}$ from each other. Note that, in the plurality of disturbance wave resonators 15, the frequency differences $df_J$ may be the same as each other or may be different from each other.

According to the configuration described above, in the second embodiment, first, effects the same as those in the modification in FIG. 5B are obtained. That is, even when the bandwidth of the space band SB is narrow, the antiresonance frequency $f_{Ja}$ can be made lower than the transmission band TxB. As a result, in the disturbance wave resonator 15, an increase of SAW vibration of the disturbance wave resonator 15 by the transmission wave no longer occurs, therefore mixing of the disturbance waves and the transmission wave in the disturbance wave resonator 15 can be reduced.

Figure 9C:
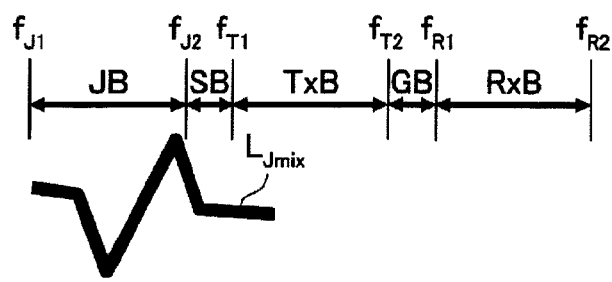

Further, in the second embodiment, as shown in FIG. 9C which shows the impedance of the plurality of disturbance wave resonators 15 as a whole by the line $L_{Jmix}$, the impedance of the plurality of disturbance wave resonators 15 as a whole can be made smaller in the disturbance wave band JB. As a result, the current of disturbance waves can be suitably made to run to the ground terminal 9.

<Third Embodiment>

Figure 10:
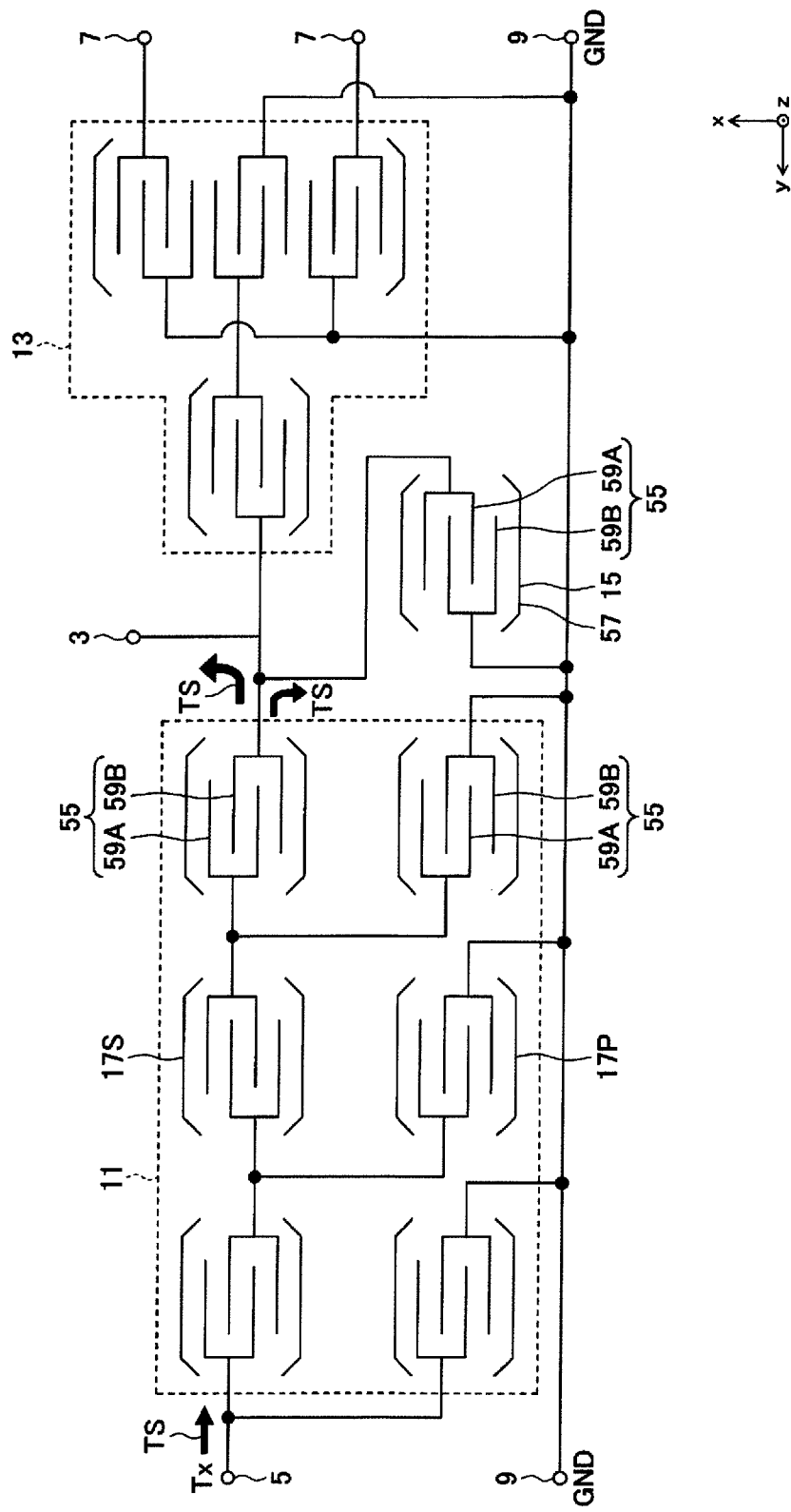
FIG. 10 A circuit diagram showing the configuration of a duplexer according to a third embodiment.

FIG. 10 is a schematic view, similar to FIG. 2, which shows a duplexer 301 according to a third embodiment.

The duplexer 301 is different from the duplexer 1 in the first embodiment in the orientation of the disturbance wave resonator 15. Specifically, this is as follows.

In the serial resonators 17S, parallel resonators 17P, and disturbance wave resonators 15 in the duplexer 1 and duplexer 301, the side on which the transmission signal TS is input (may be input) is defined as the first comb-shaped electrode 59A, and the comb-shaped electrode which is meshed with the first comb-shaped electrode 59A is defined as second comb-shaped electrode 59B.

That is, in the serial resonator 17S, the comb-shaped electrode connected to the transmission terminal 5 is the first comb-shaped electrode 59A. In the parallel resonator 17P, the comb-shaped electrode which is connected to the line of the serial resonator 17S is the first comb-shaped electrode 59A. Further, in the disturbance wave resonator 15, as shown in FIG. 10, the comb-shaped electrode which is connected to the antenna terminal 3 is the first comb-shaped electrode 59A.

Further, in the duplexer 1 in the first embodiment, the directions from the first comb-shaped electrodes 59A to the second comb-shaped electrodes 59B are the same as each other among the serial resonators 17S, parallel resonators 17P, and disturbance wave resonator 15. On the other hand, in the duplexer 301 in the present embodiment, the directions from the first comb-shaped electrodes 59A to the second comb-shaped electrodes 59B are inverse to each other between the serial resonators 17S or parallel resonators 17P and the disturbance wave resonator 15.

Here, as the factor of generation of the distorted wave based on the second-order nonlinearity, there can be mentioned the existence of a gap between the front end of an electrode finger 63 and the front end of a dummy electrode 65 (a bus bar 61 when a dummy electrode 65 is not provided). Specifically, this is as follows.

The distorted current which is generated due to the fact that the dielectric constant of the piezoelectric substrate 53 has a second-order nonlinearity does not depend on the orientation of the electrical field, but depends upon the crystal orientation. Accordingly, concerning the gap between the electrode fingers 63, a distortion current generated in the gap which is positioned on one side in the x-direction (FIG. 3) relative to the electrode finger 63 and a distortion current generated in the gap on the other side in the x-direction relative to this electrode finger 63 are inverse to each other in the orientation of current and are reduced by each other in this electrode finger 63. On the other hand, a plurality of gaps between the front ends of the plurality of electrode fingers 63 and the front ends of the plurality of dummy electrodes 65 are the same as each other in the crystal orientation from one comb-shaped electrode 59 to the other comb-shaped electrode 59, therefore distortion currents generated in these gaps are not reduced. As a result, a distorted wave corresponding to the second-order nonlinearity is generated.

In the present embodiment, the directions from the first comb-shaped electrodes 59A to the second comb-shaped electrodes 59B are inverse to each other between the serial resonator 17S or parallel resonator 17P and the disturbance wave resonator 15, therefore orientations (positive or negative) are inverse between the distortion current based on the second-order nonlinearity which flows in the first comb-shaped electrode 59A of the serial resonator 17S or parallel resonator 17P and the distortion current based on the second-order nonlinearity which flows in the first comb-shaped electrode 59A of the disturbance wave resonator 15. Further, these first comb-shaped electrodes 59A are connected to each other, therefore the distortion currents are reduced at least in part.

In this way, in the present embodiment, the disturbance wave resonator 15 contributes to not only suppression of the distorted wave corresponding to the third-order nonlinearity, but also a reduction of the distorted wave corresponding to the second-order nonlinearity. FIG. 10 showed the example in which the directions from the first comb-shaped electrodes 59A to the second comb-shaped electrodes 59B were the same in all serial resonators 17S and parallel resonators 17P, but all of them are not always the same in an actual duplexer due to the consideration of wiring among the resonators. Even in that case, the resonator which becomes the source of generation of the distorted wave corresponding to the second-order nonlinearity is the resonator in the vicinity of the antenna terminal to which a strong transmission wave and disturbance waves are applied. Therefore, in the present embodiment, by setting the directions from the first comb-shaped electrodes 59A to the second comb-shaped electrodes 59B to be inverse between the serial resonator 17S which is closest to the antenna terminal or the parallel resonator 17P which is closest to the antenna terminal and the disturbance wave resonator 15, the distorted wave corresponding to the second-order nonlinearity can be effectively reduced.

The above explanation exemplified the case where the directions from the first comb-shaped electrodes 59A to the second comb-shaped electrodes 59B of resonators were inverse to each other between the serial resonator 17S or parallel resonator 17P and the disturbance wave resonator 15, but the present invention is not limited to this. That is, it is enough that the directions from the first comb-shaped electrodes 59A toward the second comb-shaped electrodes 59B are different. Due to this, between the serial resonator 17S or parallel resonator 17P and the disturbance wave resonator 15, the resonators have distorted currents which flow corresponding to the second-order nonlinearity having opposite positive and negative components, therefore the distortion currents can be reduced.

Further, in the present embodiment, the first comb-shaped electrode 59A of the serial resonator 17S or parallel resonator 17P is one example of the input side comb-shaped electrode, the second comb-shaped electrode 59B of the serial resonator 17S or parallel resonator 17P is one example of the output side comb-shaped electrode, the first comb-shaped electrode 59A of the disturbance wave resonator 15 is one example of the antenna side comb-shaped electrode, and the second comb-shaped electrode 59B of the disturbance wave resonator 15 is one example of the ground side comb-shaped electrode.

Further, the principle due to which the distorted wave based on the second-order nonlinearity which is generated in the resonators configuring the transmission filter 11 and the distorted wave based on the second-order nonlinearity which is generated in the disturbance wave resonator 15 are reduced stands in the same way on the reception filter 13 side.

The distorted wave based on the second-order nonlinearity which is generated in the reception filter 13 is mainly generated in the IDT electrode which is present at the position electrically closest to the antenna terminal 3 in the multiplex mode type filter configured by a plurality of IDT electrodes. For this reason, by making the direction from the comb-shaped electrode connected to the antenna terminal 3 in that IDT electrode (second antenna side comb-shaped electrode) toward the comb-shaped electrode connected to the ground (second ground side comb-shaped electrode) and the direction from the first comb-shaped electrode 59A to the second comb-shaped electrode 59B in the disturbance wave resonator 15 different from each other, the distorted wave in accordance with the second-order nonlinearity can be effectively reduced.

<Fourth Embodiment>

Figure 11:
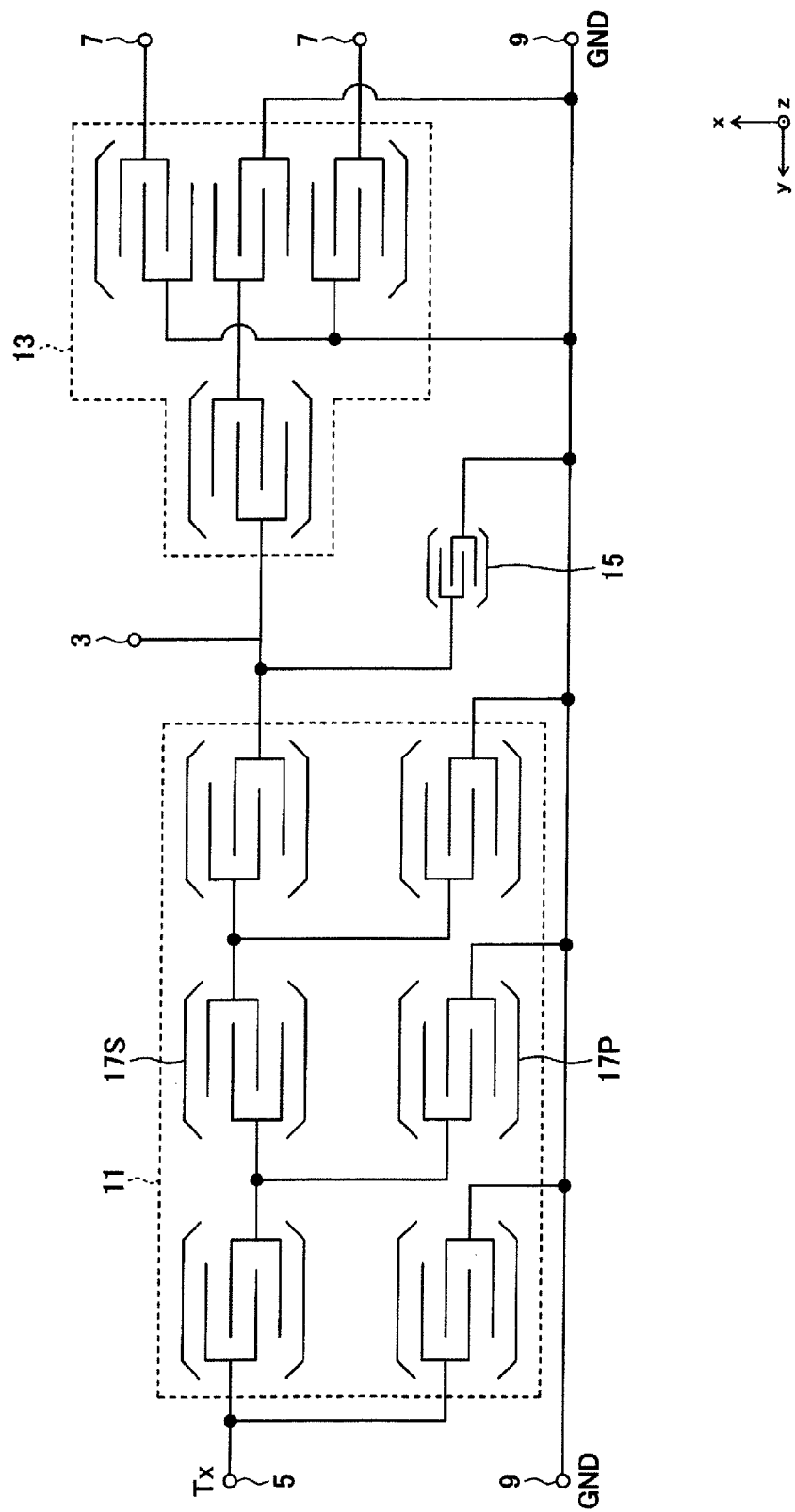
FIG. 11 A circuit diagram showing the configuration of a duplexer according to a fourth embodiment.

FIG. 11 is a schematic view, similar to FIG. 2, which shows a duplexer 401 according to a fourth embodiment.

The duplexer 401 is different from the duplexer 1 in the first embodiment in the capacity of the disturbance wave resonator 15 (size in another viewpoint). Specifically, this is as follows.

The capacity of the disturbance wave resonator 15 is made smaller than the capacity of the parallel resonator 17P (the mean value where the capacities are different from each other among a plurality of parallel resonators 17P). That difference is for example 10% or more of the capacity (mean value) of the parallel resonator 17P.

The capacity of the disturbance wave resonator 15 may be made smaller by a suitable method. For example, the disturbance wave resonator 15 has a smaller number of electrode fingers 63 than the parallel resonator 17P. In other words, the disturbance wave resonator 15 is smaller in capacity and size in the x-direction. Further, for example, the disturbance wave resonator 15 is smaller than the parallel resonator 17P in the crossing width CW (FIG. 3). In other words, the disturbance wave resonator 15 is smaller in the capacity and size in the y-direction.

The disturbance wave resonator 15 does not configure part of the transmission filter 11, therefore its capacity can be made smaller than the parallel resonator 17P as in the present embodiment. As a result, for example, design changes of the transmission filter 11 can be made smaller or the size of the duplexer 401 can be made smaller.

<Fifth Embodiment>

Figure 12A:
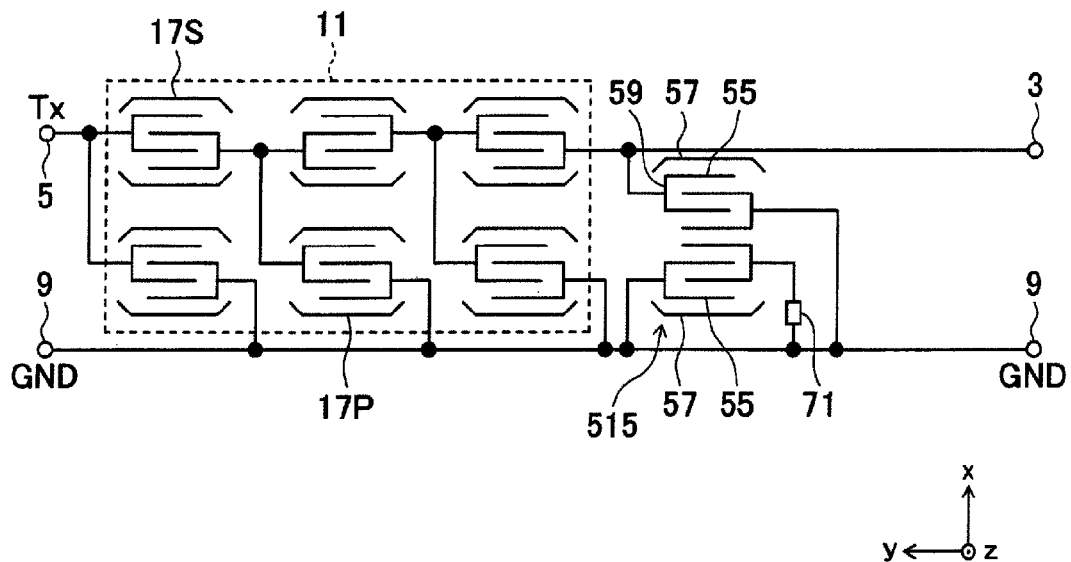
FIG. 12A and FIG. 12B are diagrams for explaining a duplexer according to a fifth embodiment.

FIG. 12A is a schematic view, similar to FIG. 2, which shows a duplexer 501 according to a fifth embodiment. Note, in FIG. 12A, illustration of the reception filter 13 and reception terminal 7 is omitted.

The duplexer 501 is different from the duplexer 1 in the first embodiment in the point that a disturbance wave resonator 515 configures a multiplex mode type filter. Specifically, this is as follows.

The disturbance wave resonator 515 has a plurality of (two in the example in FIG. 12A) IDTs 55 which are arranged in the propagation direction of SAW and reflectors 57 which are arranged on the two sides of the plurality of IDTs 55. In any IDT 55 in the disturbance wave resonator 515, one comb-shaped electrode 59 is connected to the antenna terminal 3, and the other comb-shaped electrode 59 is connected to the ground terminal 9. In the other IDT 55 which is adjacent to the above IDT 55, two comb-shaped electrodes 59 are connected to the ground terminal 9. Note, between one of those comb-shaped electrodes 59 and the ground terminal 9, an impedance element 71 configured by a resistor or inductor is interposed.

Figure 12B:
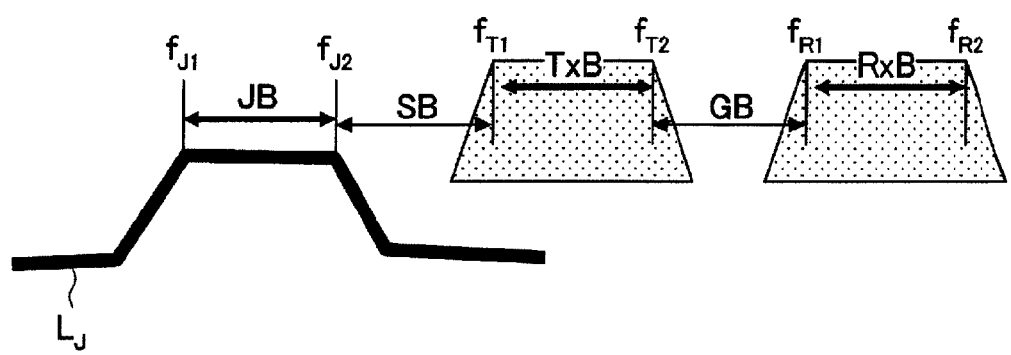

FIG. 12B is a diagram showing the frequency characteristic of the disturbance wave resonator 515. The abscissa shows the frequency in the same way as FIG. 4 etc., and the ordinate shows the attenuation amount unlike FIG. 4 etc. The disturbance wave resonator 515 configures a multiplex mode type filter, therefore has a passband over a predetermined range. The passband is set so as to become equal to the disturbance wave band JB.

Accordingly, the disturbance wave resonator 515 can suitably make the disturbance waves run to the ground terminal 9 over the entire area in the disturbance wave band JB. Note that, usually the impedance element 71 is interposed between the comb-shaped electrode 59 which outputs the passed signal and the ground terminal 9, therefore the disturbance waves can be suitably made to run to the ground terminal 9 through the other comb-shaped electrode 59 which is connected to the ground terminal 9.

Note that, the entire multiplex mode type filter was grasped as the disturbance wave resonator 515 in the explanation, but each IDT 55 (and reflector 57) may be grasped as a disturbance wave resonator which configures a multiplex mode type filter as well. The multiplex mode type filter is not limited to the longitudinally coupled type and may be a transversely coupled type as well.

<Sixth Embodiment>

Figure 13:
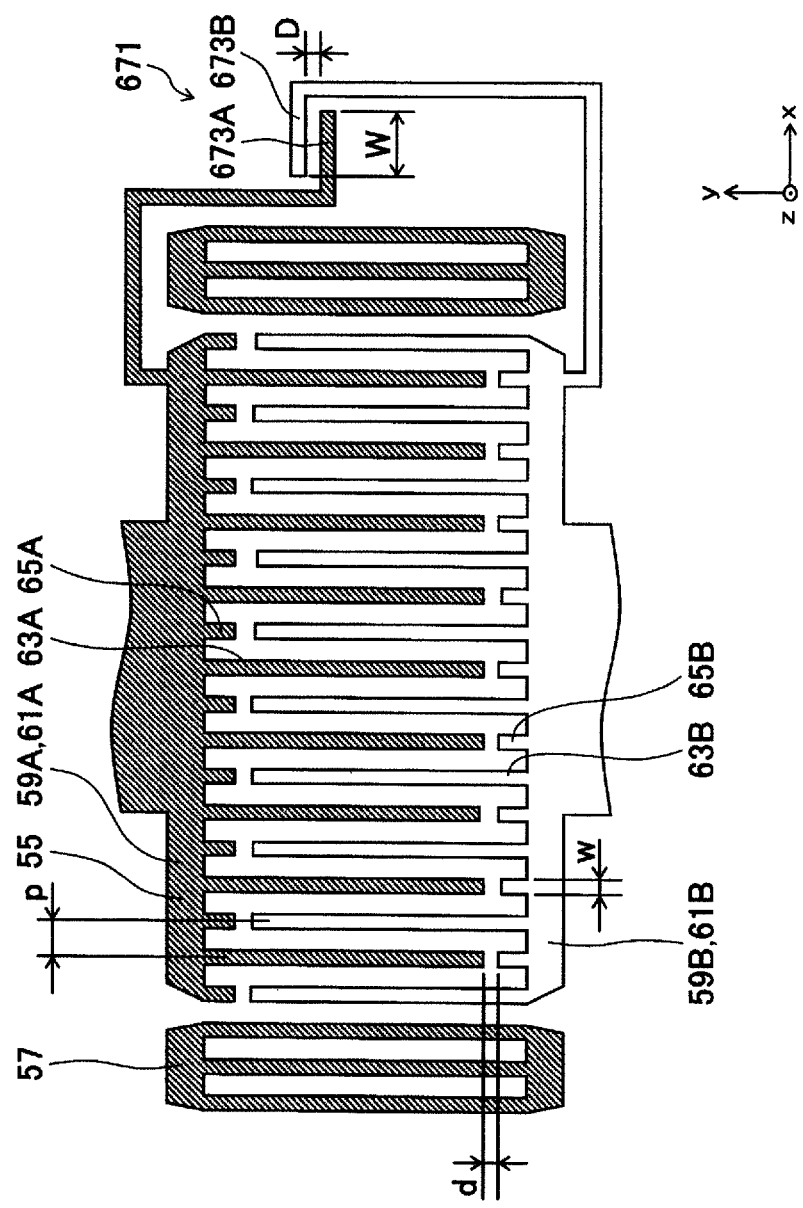
FIG. 13 A plan view showing the configuration of a disturbance wave resonator of a duplexer according to a sixth embodiment.

FIG. 13 is a plan view, similar to FIG. 3, which shows the configuration of a disturbance wave resonator 615 of a duplexer according to a sixth embodiment.

The disturbance wave resonator 615 is different from the disturbance wave resonator 15 in the first embodiment in the point that a capacitor 671 is provided. Specifically, this is as follows.

The disturbance wave resonator 615, in the same way as the first embodiment, has a pair of comb-shaped electrodes 59. In the present embodiment, the first comb-shaped electrode 59A is connected to the antenna terminal 3, and the second comb-shaped electrode 59B is connected to the ground terminal 9.

The capacitor 671 has a first capacitance electrode 673A which is connected to the first comb-shaped electrode 59A (antenna terminal 3) and a second capacitance electrode 673B which is connected to the second comb-shaped electrode 59B (ground terminal 9) and faces the first capacitance electrode 673A. The direction of arrangement from the first comb-shaped electrode 59A to the second comb-shaped electrode 59B, and the direction of arrangement from the first capacitance electrode 673A to the second capacitance electrode 673B are made different from each other. Note that, if the different directions are inverse directions, the effect of reduction of distorted waves becomes greater.

Accordingly, in the same way as the distortion currents being reduced between the serial resonator 17S or parallel resonator 17P and the disturbance wave resonator 15 in the third embodiment (FIG. 10), the distortion current generated in the IDT 55 and the distortion current generated in the capacitor 671 are reduced by each other at least in part, thus the generation of distorted waves based on the second-order nonlinearity can be reduced.

Note that, when the width and facing distance of the capacitor 671 are W and D and the width, distance, and number of the gaps of the front end of the electrode finger 63 are "w", "d", and "n", desirably the following equation is satisfied.

$$w/d^2 \times n = W/D^2$$

Considering also a case where two or more types of capacitors 671 are provided or the distance etc. of the gap of the front end of an electrode finger 63 fluctuates or the like, when generalizing this more, preferably a sum (a1) of the values obtained by dividing the width of the gap of the front end of each electrode finger 63 by a square of the distance for the plurality of electrode fingers 63 and a sum (a2) of the values obtained by dividing the width of each capacitor 671 by the square of the distance for a plurality of (or one) capacitors 671 are equal. Further, even when they are not equal, if the following equation is satisfied, it is confirmed by the inventors that a conspicuous effect is exerted:

$$0 < a2 < 2 \times a1$$

or $$0.45 \times a1 < a2 < 1.45 \times a1$$

Figure 14:
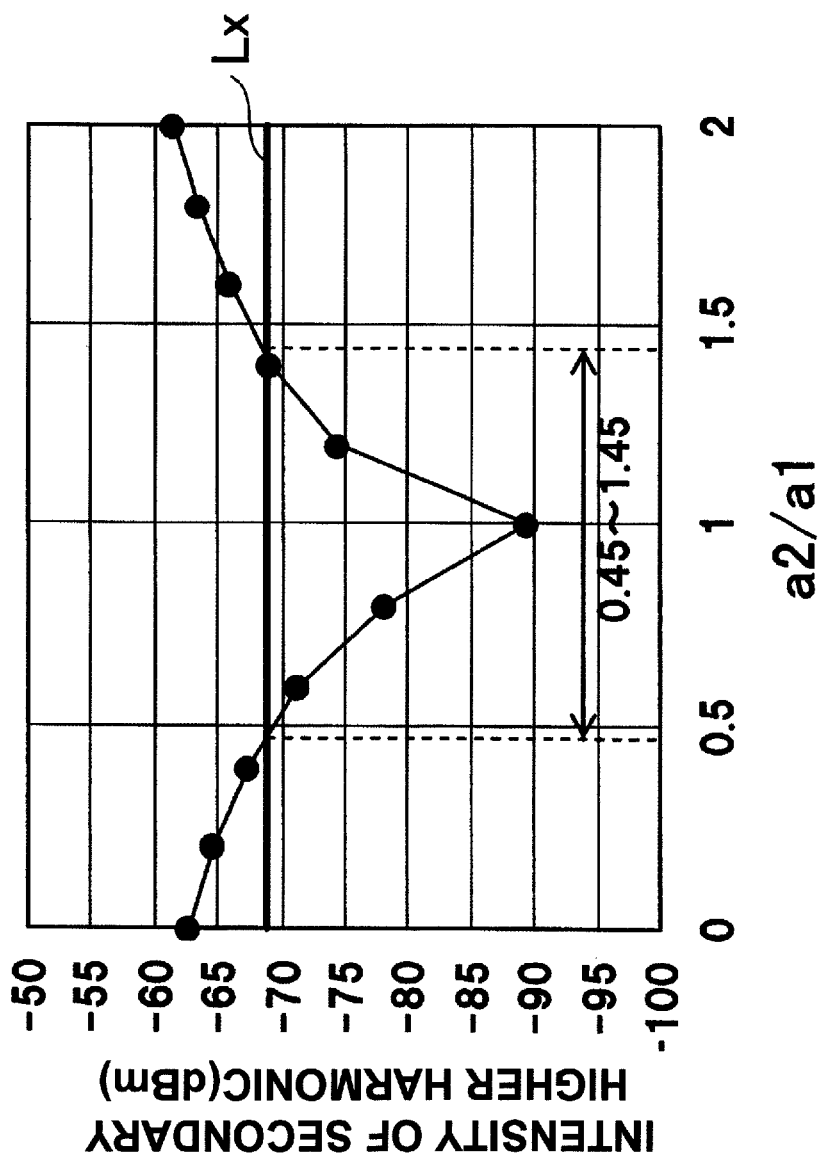
FIG. 14 A diagram for explaining a modification relating to an intensity characteristic of a secondary higher harmonic of the duplexer in FIG. 13.

FIG. 14 shows the results of simulation on how the secondary higher harmonic generated in the resonators changes in a case where a2/a1 is changed. In FIG. 14, the point at which a2/a1=0 is the result in a case where the capacitor 671 is not provided. At the time when a2/a1=1, that is a2=a1, the intensity of the secondary higher harmonic becomes the smallest. Further, other than that, even within a range where $0<a2/a1<2$, it is seen that the distorted wave is reduced more than that in the case where the capacitor 671 is not provided.

Further, Lx indicates the level of the distorted wave in a case where the resonator is serially divided into two parts as a measure for reducing the distorted wave. Even with respect to this, the intensity of the distorted wave becomes smaller than Lx within the range where $0.45<a2/a1<1.45$. Note that, serial division of the resonator into two parts means that the resonator is replaced with two resonators having doubled capacitance values and serially connected. By setting in this way, electrical power applied to individual resonators can be divided into two and therefore the distorted waves generated can be reduced while reducing deterioration of the capacity value of the resonators as a whole, consequently the impedance characteristic.

The capacitor may be configured by utilizing the bus bar 61 or suitable wiring as the first capacitance electrode or second capacitance electrode or configured by dividing the reflector 57 in the y-direction.

<Seventh Embodiment>

Figure 15:
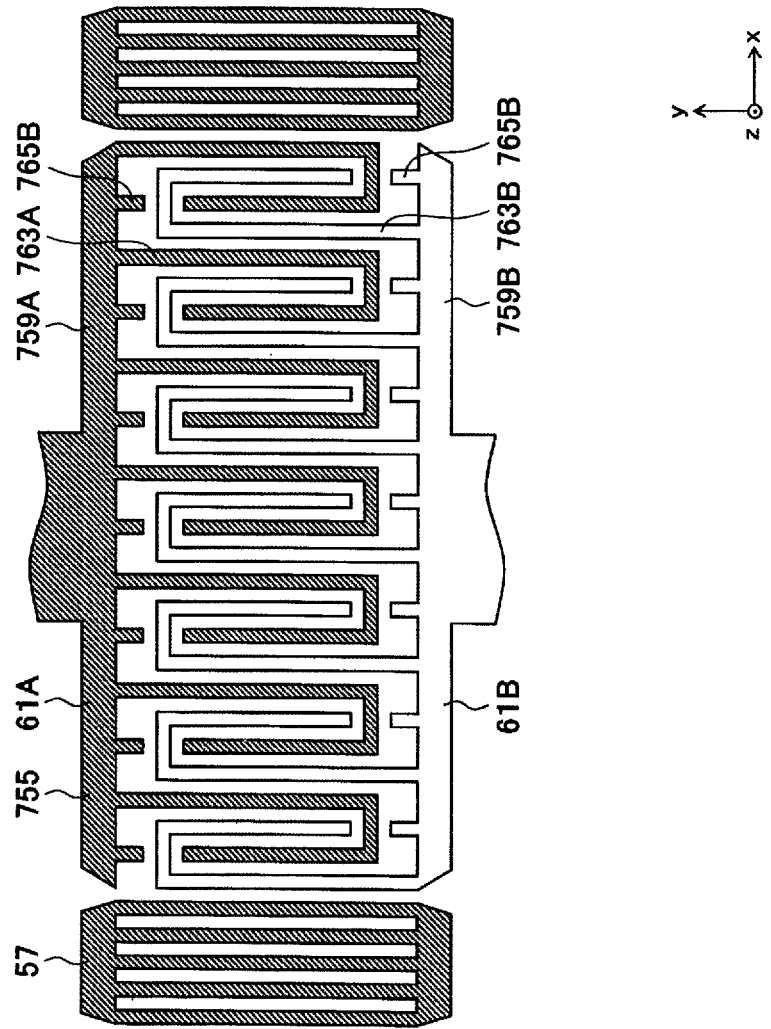
FIG. 15 A plan view showing the configuration of a disturbance wave resonator of a duplexer according to a seventh embodiment.

FIG. 15 is a plan view, similar to FIG. 3, which shows the configuration of a disturbance wave resonator 715 of a duplexer according to a seventh embodiment.

The disturbance wave resonator 715 is different from the disturbance wave resonator 15 in the first embodiment in the electrode shape of an IDT755. Specifically, this is as follows.

Each comb-shaped electrode 759 of the IDT755, in the same way as the other embodiments, has bus bars 61 and has electrode fingers 763 and dummy electrodes 765 which extend from the bus bars 61.

Note, the electrode fingers 763 are formed in hook shapes. The electrode fingers 763 of one comb-shaped electrode 759 and the electrode fingers 763 of the other comb-shaped electrode 759 are given positional relationships whereby they are hooked upon each other. That is, the first electrode fingers 763A extend from the first bus bar 61A to the second bus bar 61B side and further extend so as to turn back to the first bus bar 61A side, while the second electrode fingers 763B extend from the second bus bar 61B to the first bus bar 61A side and further extend so as to turn back to the second bus bar 61B side around the front ends of the first electrode fingers 763A.

Further, the dummy electrode 765 of each comb-shaped electrode 759 is arranged to face the front end of an electrode finger 763 of the comb-shaped electrode 759 to which the above dummy electrode 765 belongs so as to sandwich the turned back portion of the other comb-shaped electrode 759 there between. Note that, preferably the front end of the dummy electrode 765 and the front end of the electrode finger 763 which face each other are positioned so as to be symmetric with each other concerning the turned back portion of the other comb-shaped electrode 759.

In the above configuration, the turned back portion of the electrode finger 763 of one comb-shaped electrode 759 is sandwiched between the front end of the electrode finger 763 of the other comb-shaped electrode 759 and the dummy electrode 765 of the other comb-shaped electrode 759 in the y-direction. For this reason, the second-order distortion currents which are generated on the two sides of the y-direction of the turned back portion are reduced by each other in at least a portion in this turned back portion. As a result, generation of the distorted waves in accordance with the second-order nonlinearity is reduced.

Note that, even when the dummy electrode 765 is not provided, the turned back portion of one comb-shaped electrode 759 is sandwiched between the front end of the electrode finger 763 of the other comb-shaped electrode 759 and the bus bar 61 of the other comb-shaped electrode 759. Therefore the effect of reduction of the distortion currents is exerted.

<Eighth Embodiment>

Figure 16:
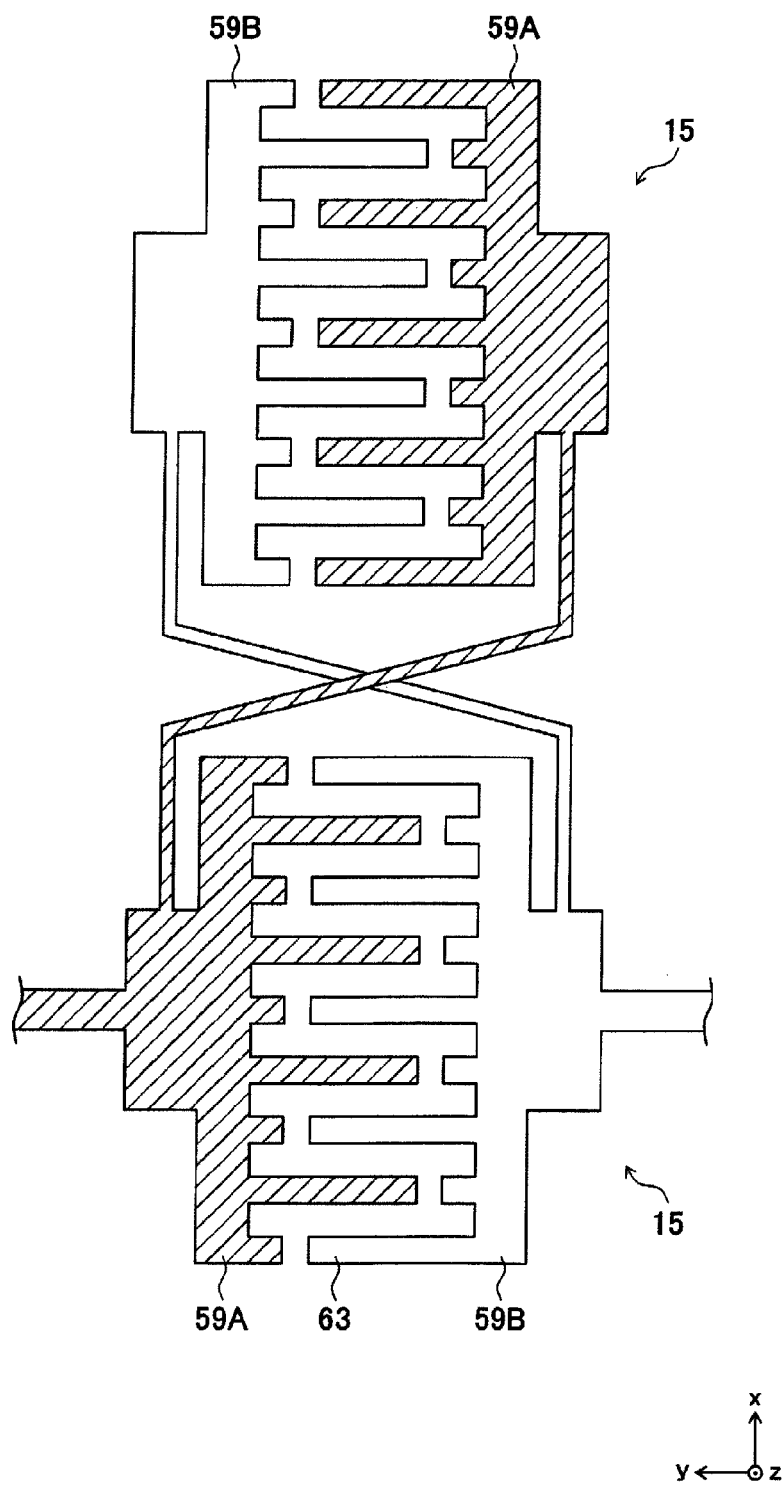
FIG. 16 A plan view showing the configuration of a disturbance wave resonator of a duplexer according to an eighth embodiment.

FIG. 16 is a plan view, similar to FIG. 3, which shows the configuration of the disturbance wave resonator 15 of a duplexer according to an eighth embodiment.

The duplexer in the present embodiment, in the same way as the second embodiment (FIG. 9), has two disturbance wave resonators 15 which are connected in parallel. In the present embodiment, the first comb-shaped electrodes 59A are connected to the antenna terminal 3, while the second comb-shaped electrodes 59B are connected to the ground terminal 9. Further, in the two disturbance wave resonators 15, the arrangement directions from the first comb-shaped electrodes 59A to the second comb-shaped electrodes 59B are made inverse to each other. Note that, so far as the arrangement directions from the first comb-shaped electrodes 59A to the second comb-shaped electrodes 59B are different from each other, the same effect as that in the case where the arrangement directions become inverse directions is exerted.

Accordingly, in the same way as the sixth embodiment (FIG. 13) in which the second-order distortion currents were reduced between the disturbance wave resonator 15 and the capacitor 671, the second-order distortion currents generated in the disturbance wave resonators 15 are reduced in at least a portion between the two disturbance wave resonators 15. Note that, by giving roughly the same configurations to the two disturbance wave resonators 15, the design can be facilitated.

In the present embodiment, the two disturbance wave resonators 15 are connected in parallel. Note, between the serially connected two disturbance wave resonators 15, the directions from the first comb-shaped electrodes 59A to the second comb-shaped electrodes 59B may become different directions from each other as well. Note that, in the case where the directions are made inverse orientations, the effect of reduction of the distortion currents becomes large.

In this case, the second comb-shaped electrode 59B (ground terminal side comb-shaped electrode) of the disturbance wave resonator 15 on the antenna terminal 3 side is connected through the disturbance wave resonator 15 on the ground terminal 9 side to the ground terminal 9, and the first comb-shaped electrode 59A (antenna terminal side comb-shaped electrode) on the ground terminal 9 side is connected through the disturbance wave resonator 15 on the antenna terminal 3 side to the antenna terminal 3.

In the present embodiment, the first comb-shaped electrodes 59A of the disturbance wave resonators 15 are one example of the antenna side comb-shaped electrode, and the second comb-shaped electrodes 59B of the disturbance wave resonators 15 are one example of the ground side comb-shaped electrode.

Figure 17:
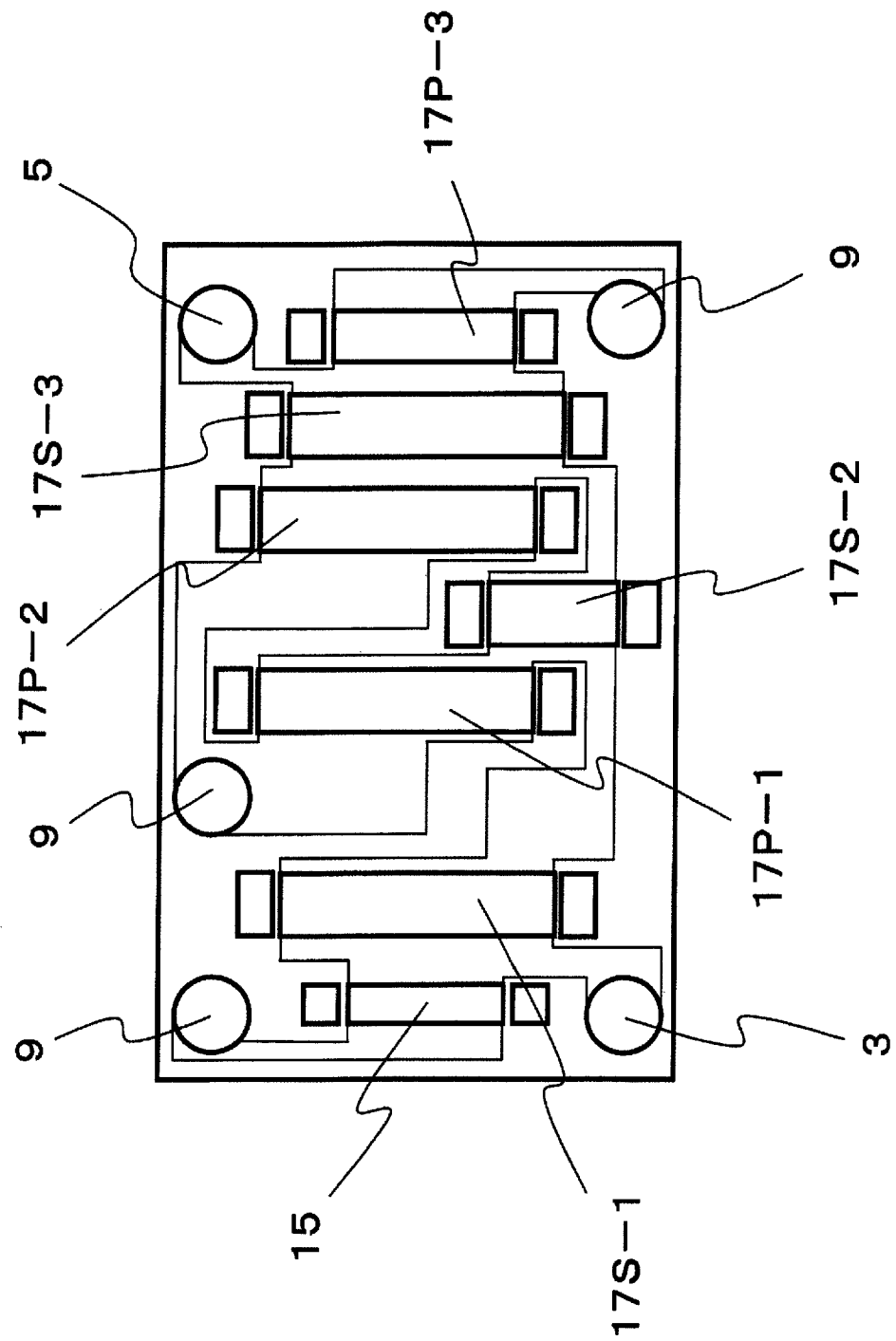
FIG. 17 A plan view showing the configuration of a transmission filter portion of the duplexer in FIG. 2.

FIG. 17 shows a concrete example of arrangement of the disturbance wave resonator 15. In this example, the disturbance wave resonator 15 is arranged on outer side from the transmission filter 11. By installation on the same substrate 53 as the other resonator configuring the transmission filter 11 in this way, the resonator configuring the transmission filter 11 and the disturbance wave resonator 15 can be manufactured by the same manufacturing method, therefore the productivity can be improved. Further, by providing the disturbance wave resonator 15 between the ground terminal 9 and the antenna terminal 3, the distance of flow of the disturbance waves can be made shorter.

The present invention is not limited to the above embodiments and may be executed in various aspects. The modifications and embodiments explained above may be suitably combined.

So far as the transmission filter or reception filter includes an acoustic resonator, the duplexer can generate a distorted wave in accordance with the third-order or second-order nonlinearity in which the transmission wave and the disturbance waves are mixed. Accordingly, the present invention can be applied to a duplexer having a transmission filter or reception filter including an acoustic resonator. From another viewpoint, any of the transmission filter and reception filter and disturbance wave resonator need not include an acoustic element.

The acoustic wave element included in the duplexer is not limited to a SAW element (in a narrow sense). For example, it may be a so-called elastic boundary wave element (note, included in the SAW element in a broad sense) as well in which the thickness of the protective layer covering the IDT is relatively large (for example $0.5\lambda$ to $2\lambda$). Further, for example, the acoustic wave element may be a BAW element as well which utilizes a bulk acoustic wave (BAW).

Figure 18:
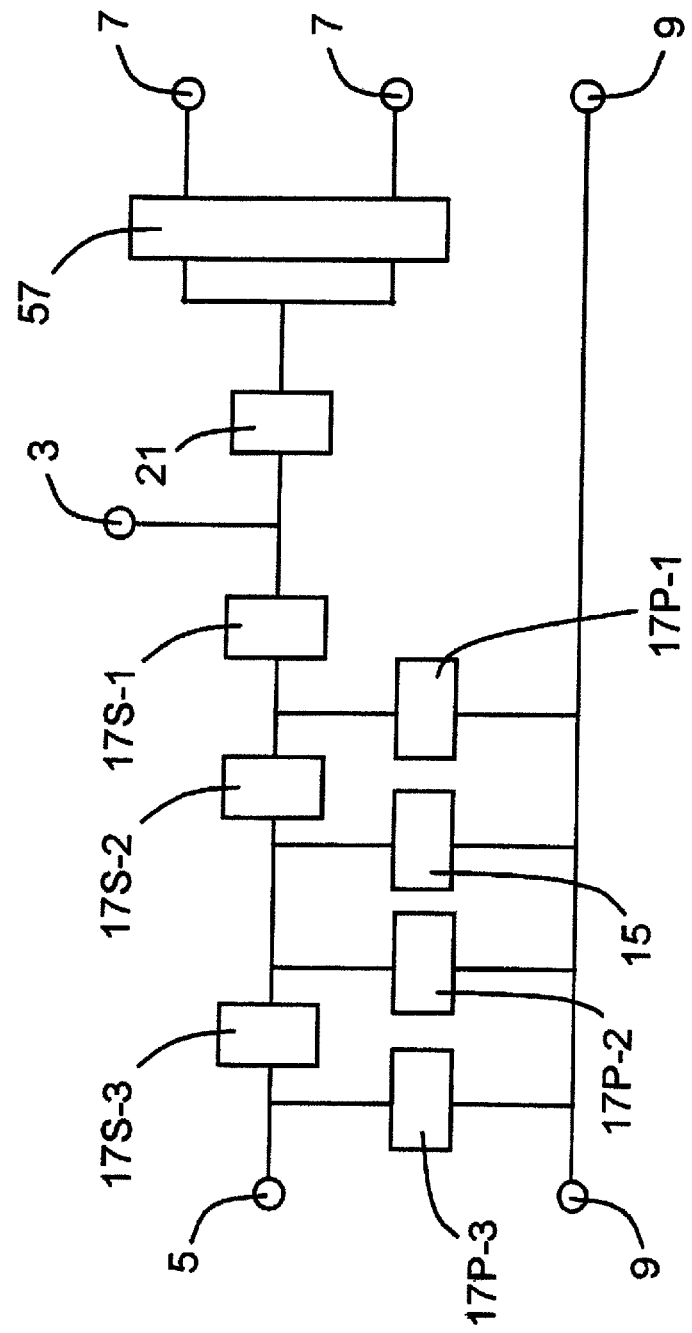
FIG. 18 A circuit diagram showing the configuration of the duplexer in FIG. 1.

In the embodiments explained above, an explanation was given of the case where the disturbance wave resonator 15 was arranged closer to the antenna terminal 3 side than the transmission filter 11. However, the disturbance wave resonator 15 may be arranged in the transmission filter 11 as well. When the transmission filter 11 is configured by a ladder type filter, as shown in FIG. 18, it is for example connected so as to become parallel to the parallel resonators. Even in a case where the disturbance wave resonator 15 is arranged in the transmission filter 11 in this way, the influence of the distorted wave can be reduced. Note that, the disturbance wave resonator 15 may be arranged in the reception filter 13 as well.

The transmission filter is not limited to a ladder type filter, and the reception filter is not limited to a multiplex mode type filter. For example, the transmission filter may be configured by a multiplex mode type filter as well.

When the transmission filter is a ladder type filter, the resonator which is closest to the antenna terminal among the plurality of resonators provided in the transmission filter may be a parallel resonator as well.

The transmission filter and the reception filter may be provided on piezoelectric substrates which are different from each other as well. In this case, the disturbance wave resonator may be provided on the piezoelectric substrate provided with the transmission filter or may be provided on the piezoelectric substrate provided with the reception filter. In general, the transmission filter becomes larger than the reception filter. Therefore, if the disturbance wave resonator is provided on the piezoelectric substrate provided with the reception filter, a reduction of size of the duplexer as a whole may be expected.

Further, in the above explanation, the case where the disturbance wave resonator 15 was provided in order to reduce the influence of a distorted wave was explained. However, a band pass filter may be arranged in place of the disturbance wave resonator 15 as well.

REFERENCE SIGNS LIST

1 ... duplexer, 3 ... antenna terminal, 11 ... transmission filter, 13 ... reception filter, and 15 ... disturbance wave resonator.

The invention claimed is:

1. A duplexer, comprising:
   an antenna terminal which receives signal waves and disturbance waves,
   a transmission filter which is connected to the antenna terminal,
   a reception filter which is connected to the antenna terminal, and receives a portion of the signal waves, and has a passband of a frequency range higher than a passband of the transmission filter, and
   a disturbance wave resonator which is connected to the antenna terminal and to a ground and positioned closer to a side of the antenna terminal than the transmission filter and the reception filter,
   wherein a resonance frequency of the disturbance wave resonator is within a disturbance wave band which is a frequency range lower than the passband of the transmission filter and which includes a frequency range of the disturbance waves,
   wherein a antiresonance frequency of the disturbance wave resonator is deviated relative to a frequency at the center of the passband of the transmission filter by an extent of 10% or more of a bandwidth of the passband of the transmission filter, and wherein the antiresonance frequency of the disturbance wave resonator is lower than the passband of the transmission filter.

2. The duplexer according to claim 1, wherein the antiresonance frequency of the disturbance wave resonator is higher than the disturbance wave band.

3. The duplexer according to claim 1, wherein a frequency difference from the resonance frequency to the antiresonance frequency of the disturbance wave resonator is smaller than a bandwidth of the passband of the transmission filter by a difference of 10% or more of the bandwidth of the transmission filter.

4. The duplexer according to claim 1, wherein a frequency difference from the resonance frequency to the antiresonance frequency of the disturbance wave resonator is larger than a bandwidth of the passband of the transmission filter by a difference of 10% or more of the bandwidth of the transmission filter.

5. The duplexer according to claim 1, wherein a bandwidth of a guard band between the passband of the transmission filter and the passband of the reception filter is larger than a half of the bandwidth of the passband of the transmission filter.

6. The duplexer according to claim 1, comprising a plurality of the disturbance wave resonators, wherein the plurality of disturbance wave resonators are different in the resonance frequency from each other and are connected in parallel to each other.

7. The duplexer according to claim 1, wherein the disturbance wave resonator has a plurality of resonance frequencies.

8. The duplexer according to claim 1, wherein:
   the disturbance wave resonator comprises
      an antenna side comb-shaped electrode which is provided on a piezoelectric substrate and is connected to the antenna terminal, and
      a ground side comb-shaped electrode which is provided on the piezoelectric substrate, is connected to the ground, and is meshed with the antenna side comb-shaped electrode.

9. The duplexer according to claim 1, wherein the transmission filter is a ladder type filter having serial resonators and parallel resonators.

10. The duplexer according to claim 9, wherein a maximum value of a phase of an impedance of the disturbance wave resonator is smaller than a mean value of maximum values of phases of impedances of the parallel resonators.

11. The duplexer according to claim 9, wherein distances of gaps of front ends of electrode fingers of the disturbance wave resonator are larger than a mean value of distances of gaps of front ends of electrode fingers of the parallel resonators.

12. The duplexer according to claim 9, wherein a capacity of the disturbance wave resonator is smaller than a mean value of capacities of the parallel resonators.

13. The duplexer according to claim 9, wherein:
the disturbance wave resonator comprises
an antenna side comb-shaped electrode which is provided on a piezoelectric substrate and is connected to the antenna terminal, and
a ground side comb-shaped electrode which is provided on the piezoelectric substrate, is connected to the ground, and is meshed with the antenna side comb-shaped electrode,
the parallel resonator has
a second input side comb-shaped electrode which is provided on the piezoelectric substrate and to which the transmission signal is input and
a second output side comb-shaped electrode which is provided on the piezoelectric substrate, is connected to the ground, and is meshed with the second input side comb-shaped electrode, and
a direction from the second input side comb-shaped electrode to the second output side comb-shaped electrode in the parallel resonator which is provided in the transmission filter and is closest to the antenna terminal and a direction from the antenna side comb-shaped electrode to the ground side comb-shaped electrode are directions different from each other.

14. The duplexer according to claim 9, wherein:
the disturbance wave resonator comprises
an antenna side comb-shaped electrode which is provided on a piezoelectric substrate and is connected to the antenna terminal, and
a ground side comb-shaped electrode which is provided on the piezoelectric substrate, is connected to the ground, and is meshed with the antenna side comb-shaped electrode,
the reception filter includes a multiplex mode type filter configured by a plurality of acoustic wave resonators,
the multiplex mode type filter is provided on the piezoelectric substrate, the acoustic wave resonator which is at the position electrically closest to the antenna terminal among the plurality of acoustic wave resonators has a second antenna side comb-shaped electrode on the antenna terminal side and a second ground side comb-shaped electrode which is connected to the ground and is meshed with the antenna side comb-shaped electrode, and
a direction from the second antenna side comb-shaped electrode to the second ground side comb-shaped electrode and a direction from the antenna side comb-shaped electrode to the ground side comb-shaped electrode are directions different from each other.

15. The duplexer according to claim 9, wherein:
the disturbance wave resonator comprises
an antenna side comb-shaped electrode which is provided on a piezoelectric substrate and is connected to the antenna terminal, and
a ground side comb-shaped electrode which is provided on the piezoelectric substrate, is connected to the ground, and is meshed with the antenna side comb-shaped electrode,
the disturbance wave resonator has
a first bus bar which is provided on the piezoelectric substrate,
a second bus bar which is provided on the piezoelectric substrate and faces the first bus bar,
a plurality of first electrode fingers which are provided on the piezoelectric substrate, extend from the first bus bar to the second bus bar, and further turn back to the first bus bar side, and
a plurality of second electrode fingers which are provided on the piezoelectric substrate, extend from the second bus bar to the first bus bar, and further turn back around the front ends of the plurality of first electrode fingers.

16. The duplexer according to claim 1, wherein the disturbance wave resonator configures a multiplex mode type resonator filter.

17. The duplexer according to claim 1, comprising two disturbance wave resonators, wherein
each of the two disturbance wave resonators has
an antenna side comb-shaped electrode which is provided on the piezoelectric substrate and is connected to the antenna terminal and
a ground side comb-shaped electrode which is provided on the piezoelectric substrate, is connected to the ground, and is meshed with the antenna side comb-shaped electrode, and
directions of the two disturbance wave resonators from the antenna side comb-shaped electrodes to the ground side comb-shaped electrodes are different from each other.

18. A communication module having a duplexer according to claim 1, an antenna electrically connected to the antenna terminal, and an RF-IC electrically connected to the duplexer.

19. A duplexer, comprising,
an antenna terminal which receives signal waves and disturbance waves,
a transmission filter which is connected to the antenna terminal,
a reception filter which is connected to the antenna terminal, and receives a portion of the signal waves, and has a passband of a frequency range higher than a passband of the transmission filter, and
a disturbance wave resonator which is connected to the antenna terminal and to a ground and positioned closer to a side of the antenna terminal than the transmission filter and the reception filter,
wherein a resonance frequency of the disturbance wave resonator is within a disturbance wave band which is a frequency range lower than the passband of the transmission filter and which includes a frequency range of the disturbance waves,
wherein a antiresonance frequency of the disturbance wave resonator is deviated relative to a frequency at the center of the passband of the transmission filter by an extent of 10% or more of a bandwidth of the passband of the transmission filter, and
wherein the antiresonance frequency of the disturbance wave resonator is higher than the passband of the transmission filter.

20. A duplexer, comprising:
an antenna terminal which receives signal waves and disturbance waves,
a transmission filter which is connected to the antenna terminal,
a reception filter which is connected to the antenna terminal, and receives a portion of the signal waves, and has a passband of a frequency range higher than a passband of the transmission filter, and
a disturbance wave resonator which is connected to the antenna terminal and to a ground and positioned closer to a side of the antenna terminal than the transmission filter and the reception filter,
wherein a resonance frequency of the disturbance wave resonator is within a disturbance wave band which is a frequency range lower than the passband of the transmission filter and which includes a frequency range of the disturbance waves,
wherein:
the disturbance wave resonator comprises
an antenna side comb-shaped electrode which is provided on a piezoelectric substrate and is connected to the antenna terminal, and
a ground side comb-shaped electrode which is provided on the piezoelectric substrate, is connected to the ground, and is meshed with the antenna side comb-shaped electrode,
wherein the transmission filter is a ladder type filter having serial resonators and parallel resonators,
the serial resonator has
an input side comb-shaped electrode which is provided on the piezoelectric substrate and to which the transmission signal is input and
an output side comb-shaped electrode which is provided on the piezoelectric substrate, is connected to the antenna terminal, and is meshed with the input side comb-shaped electrode, and
a direction from the input side comb-shaped electrode to the output side comb-shaped electrode in the serial resonator which is provided in the transmission filter and closest to the antenna terminal and a direction from the antenna side comb-shaped electrode to the ground side comb-shaped electrode are directions different from each other.

21. The duplexer according to claim 20, wherein a anti-resonance frequency of the disturbance wave resonator is deviated relative to a frequency at the center of the passband of the transmission filter by an extent of 10% or more of a bandwidth of the passband of the transmission filter.

22. A duplexer, comprising:
an antenna terminal which receives signal waves and disturbance waves,
a transmission filter which is connected to the antenna terminal,
a reception filter which is connected to the antenna terminal, and receives a portion of the signal waves, and has a passband of a frequency range higher than a passband of the transmission filter, and
a disturbance wave resonator which is connected to the antenna terminal and to a ground and positioned closer to a side of the antenna terminal than the transmission filter and the reception filter,
wherein a resonance frequency of the disturbance wave resonator is within a disturbance wave band which is a frequency range lower than the passband of the transmission filter and which includes a frequency range of the disturbance waves,
wherein:
the disturbance wave resonator comprises
an antenna side comb-shaped electrode which is provided on a piezoelectric substrate and is connected to the antenna terminal, and
a ground side comb-shaped electrode which is provided on the piezoelectric substrate, is connected to the ground, and is meshed with the antenna side comb-shaped electrode,
wherein the transmission filter is a ladder type filter having serial resonators and parallel resonators,
the disturbance wave resonator has
a first capacitance electrode which is provided on the piezoelectric substrate and is connected to the antenna side comb-shaped electrode and
a second capacitance electrode which is provided on the piezoelectric substrate, is connected to the ground side comb-shaped electrode, and faces the first capacitance electrode, and
a direction from the antenna side comb-shaped electrode to the ground side comb-shaped electrode and a direction from the first capacitance electrode to the second capacitance electrode are directions different from each other.

* * * * *